United States Patent
Kuroda et al.

(10) Patent No.: US 11,726,247 B2
(45) Date of Patent: *Aug. 15, 2023

(54) DISPLAY DEVICE AND METHOD FOR SELECTING OPTICAL FILM OF DISPLAY DEVICE

(71) Applicants: DAI NIPPON PRINTING CO., LTD., Tokyo (JP); Yasuhiro Koike, Yokohama (JP)

(72) Inventors: Takashi Kuroda, Moriya (JP); Yasuhiro Koike, Yokohama (JP)

(73) Assignees: DAI NIPPON PRINTING CO., LTD., Tokyo (JP); Yasuhiro Koike, Kanagawa (JP)

( * ) Notice: Subject to any disclaimer, the term of this patent is extended or adjusted under 35 U.S.C. 154(b) by 302 days.

This patent is subject to a terminal disclaimer.

(21) Appl. No.: 17/024,146

(22) Filed: Sep. 17, 2020

(65) Prior Publication Data

US 2021/0003760 A1 Jan. 7, 2021

Related U.S. Application Data

(63) Continuation of application No. 16/068,541, filed as application No. PCT/JP2017/000229 on Jan. 6, 2017, now Pat. No. 10,890,704.

(30) Foreign Application Priority Data

Jan. 8, 2016 (JP) .................................. 2016-002920

(51) Int. Cl.
*G02B 5/30* (2006.01)
*G09F 9/00* (2006.01)
(Continued)

(52) U.S. Cl.
CPC ............. *G02B 5/3083* (2013.01); *G02B 5/30* (2013.01); *G02F 1/13363* (2013.01);
(Continued)

(58) Field of Classification Search
CPC ..................... G02B 5/30–3058; G02B 5/3083; G02B 5/20; G02B 5/22; G02B 5/223;
(Continued)

(56) References Cited

U.S. PATENT DOCUMENTS 10,054,816 B2   8/2018   Koike et al.
10,067,387 B2   9/2018   Yamada et al.
(Continued)

FOREIGN PATENT DOCUMENTS

CN    102330914    1/2012
CN    104090408    10/2014
(Continued)

OTHER PUBLICATIONS

International Telecommunication Union (ITU-R), "Recommendation BT.2020-2", Oct. 2015, https://www.itu.int/dms_pubrec/itu-r/rec/bt/R-REC-BT.2020-2-201510-I!!PDF-E.pdf, accessed online on Sep. 29, 2022 (Year: 2015).*
(Continued)

*Primary Examiner* — Stephone B Allen
*Assistant Examiner* — Adam W Booher
(74) *Attorney, Agent, or Firm* — Hamre, Schumann, Mueller & Larson, P.C.

(57) ABSTRACT

There is provided a display device exhibiting a good color reproducibility, even when observed through polarized sunglasses. A display device comprises a polarizer a and an optical film X on a surface on a light emitting surface side of a display element, wherein $L_1$, which is the light incident vertically on the optical film X, among light incident on the optical film X from the display element side, satisfies a
(Continued)

specific condition, and $L_2$, which is the light emitting vertically from the light emitting surface side of the optical film X, and passing through a polarizer b having the absorption axis parallel to the absorption axis of the polarizer a, satisfies a specific condition.

13 Claims, 8 Drawing Sheets

(51) Int. Cl.
    *H05B 33/02*     (2006.01)
    *G02F 1/13363*     (2006.01)
    *H10K 50/00*     (2023.01)
    *G02F 1/1335*     (2006.01)

(52) U.S. Cl.
    CPC .......... *G02F 1/133634* (2013.01); *G09F 9/00* (2013.01); *H05B 33/02* (2013.01); *H10K 50/00* (2023.02); *G02F 1/133562* (2021.01); *G02F 1/133637* (2021.01); *G02F 2202/40* (2013.01); *G02F 2413/05* (2013.01)

(58) Field of Classification Search
    CPC . G02B 5/28; G02F 1/13363; G02F 1/133634; G02F 1/01; G02F 1/0136; G02F 1/0311; G02F 1/1335; G02F 1/133528; G02F 1/133533; G02F 1/133509; G02F 1/133514; G02F 1/133562; G02F 1/133637; G02F 2203/055; G02F 2202/40; G02F 2413/05; G09F 9/00; H01L 51/50; H05B 33/02
    See application file for complete search history.

(56) References Cited

U.S. PATENT DOCUMENTS

| | | | |
|---|---|---|---|
| 10,890,704 B2 * | 1/2021 | Kuroda | H01L 51/50 |
| 2011/0309325 A1 | 12/2011 | Park et al. | |
| 2012/0229732 A1 | 9/2012 | Koike et al. | |
| 2014/0104545 A1 | 4/2014 | Miyazawa et al. | |
| 2014/0168579 A1 | 6/2014 | Kim et al. | |
| 2014/0178706 A1 | 6/2014 | Park et al. | |
| 2014/0211130 A1 | 7/2014 | Kim | |
| 2015/0293390 A1 | 10/2015 | Tsunekawa | |
| 2015/0331282 A1 | 11/2015 | Yamada et al. | |
| 2016/0026040 A1 | 1/2016 | Qiu et al. | |
| 2016/0306230 A1 | 10/2016 | Yamada et al. | |
| 2019/0011620 A1 | 1/2019 | Kuroda et al. | |
| 2019/0064416 A1 | 2/2019 | Kuroda et al. | |

FOREIGN PATENT DOCUMENTS

| | | |
|---|---|---|
| EP | 2853995 | 4/2015 |
| JP | 2008-256819 | 10/2008 |
| JP | 2009-205928 | 9/2009 |
| JP | 2009-251000 | 10/2009 |
| JP | 2011107198 | 6/2011 |
| JP | 2011215646 | 10/2011 |
| JP | 2014-153561 | 8/2014 |
| JP | 2014-215501 | 11/2014 |
| JP | 2015129893 | 7/2015 |
| JP | 2015207377 | 11/2015 |
| JP | 2015-215577 | 12/2015 |
| JP | 2015-225129 | 12/2015 |
| TW | 201437701 | 10/2014 |
| WO | 2011/058774 | 5/2011 |
| WO | 2014/123724 | 8/2014 |
| WO | 2015/105058 | 7/2015 |

OTHER PUBLICATIONS

"Bravia no Kogashitsu," 2014, Retrieved from the Internet on Feb. 28, 2017, http://www.sony.jp/bravia/featured/picture.html (Cited in International Search Report; English description of device included.).

International Search Report issued for International Patent Application No. PCT/JP2017/000229, dated Mar. 14, 2017, 5 pages including English translation.

The Extended European Search Report issued in European application No. 17736010.4, dated Jul. 31, 2019, 7 pages.

International Search Report issued for International Patent Application No. PCT/JP2017/006616, dated May 16, 2017, 5 pages including English translation.

The Extended European Search Report issued in European Patent Application No. 17759768, dated Sep. 20, 2019, 8 pages.

Office Action issued for the corresponding European Patent Application No. 17736010.4, dated Jul. 17, 2020, 5 pages.

Lee et al., Quantum Dot LED (QLED) Emerging as Next-generation Display Technology, https://www.researchgate.net publication/ 313286560_Quantum_Dot_LED_QLED_Emerging_as_a_Next-generation_Display_ Technolog, published Nov. 2014, accessed online Feb. 10, 2020 (Year: 2014); See at least Fig. 3(b) and its concise explanation.

Office Action issued for Chinese Patent Application No. 201780005703. 5, dated Nov. 16, 2020, 6 pages.

Office Action issued for Chinese Patent Application No. 201910597750. 4, dated Nov. 17, 2020, 6 pages.

* cited by examiner

[FIG. 1]
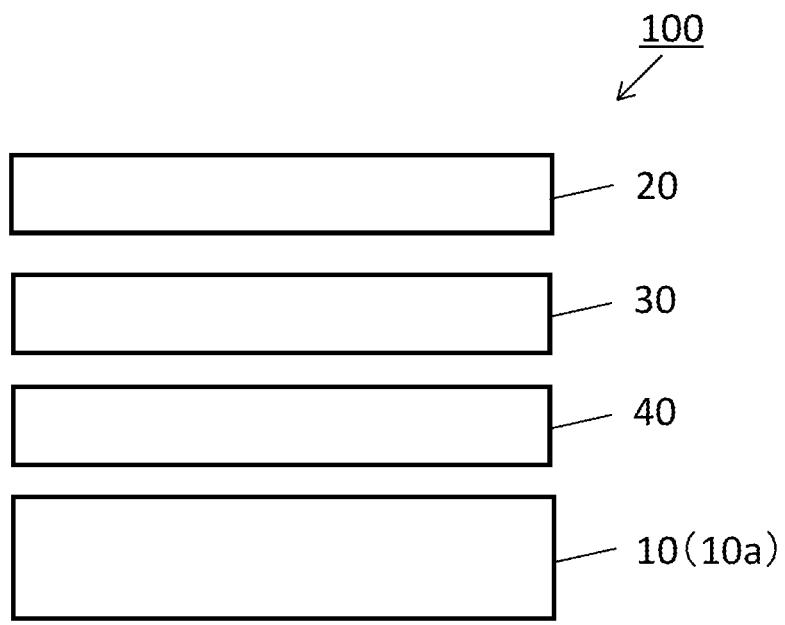

[FIG. 2]
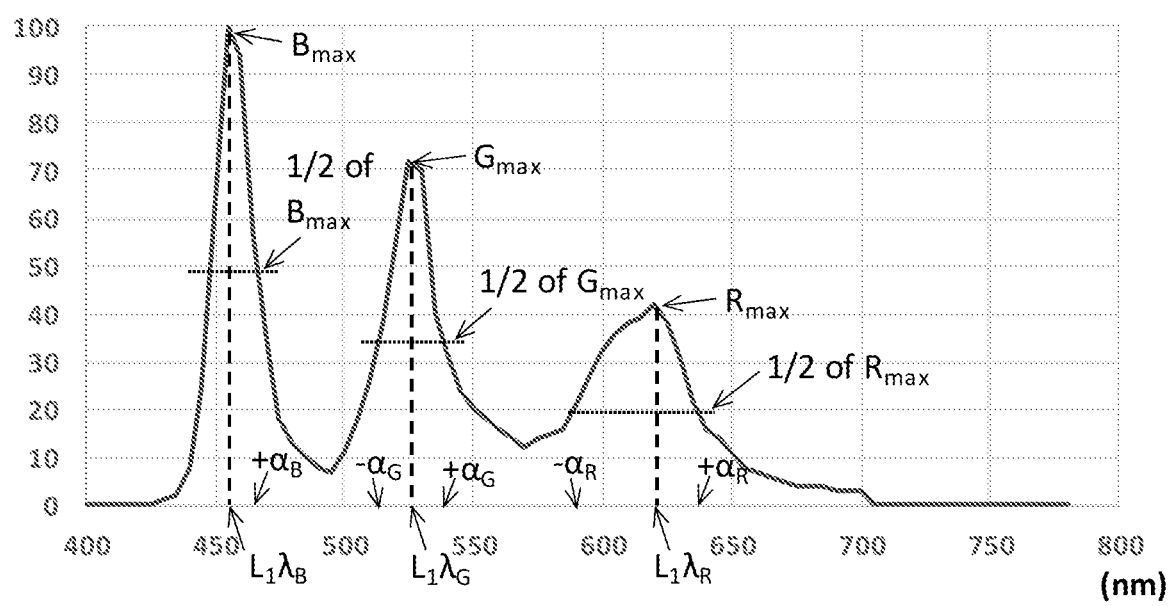

[FIG. 3]
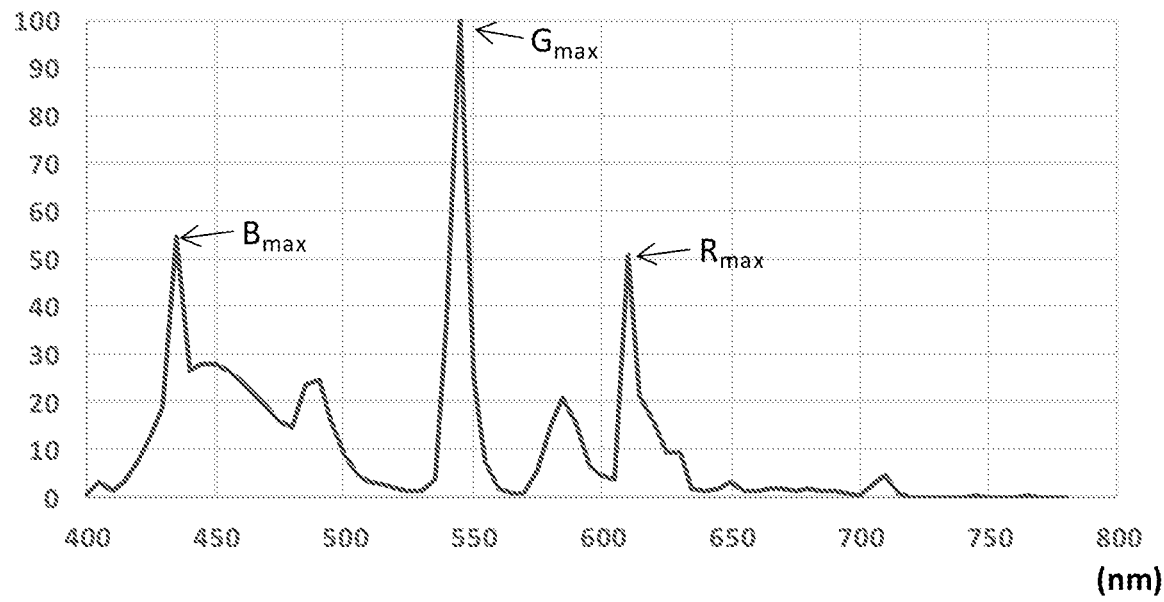
[FIG. 4]
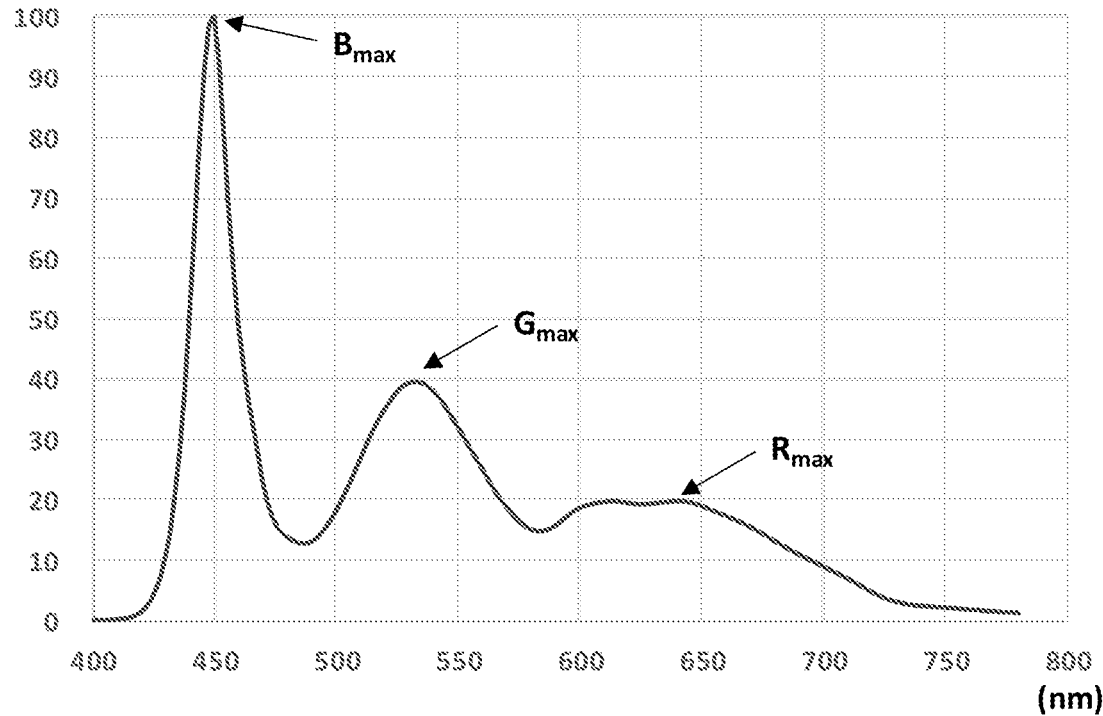

[FIG. 5]
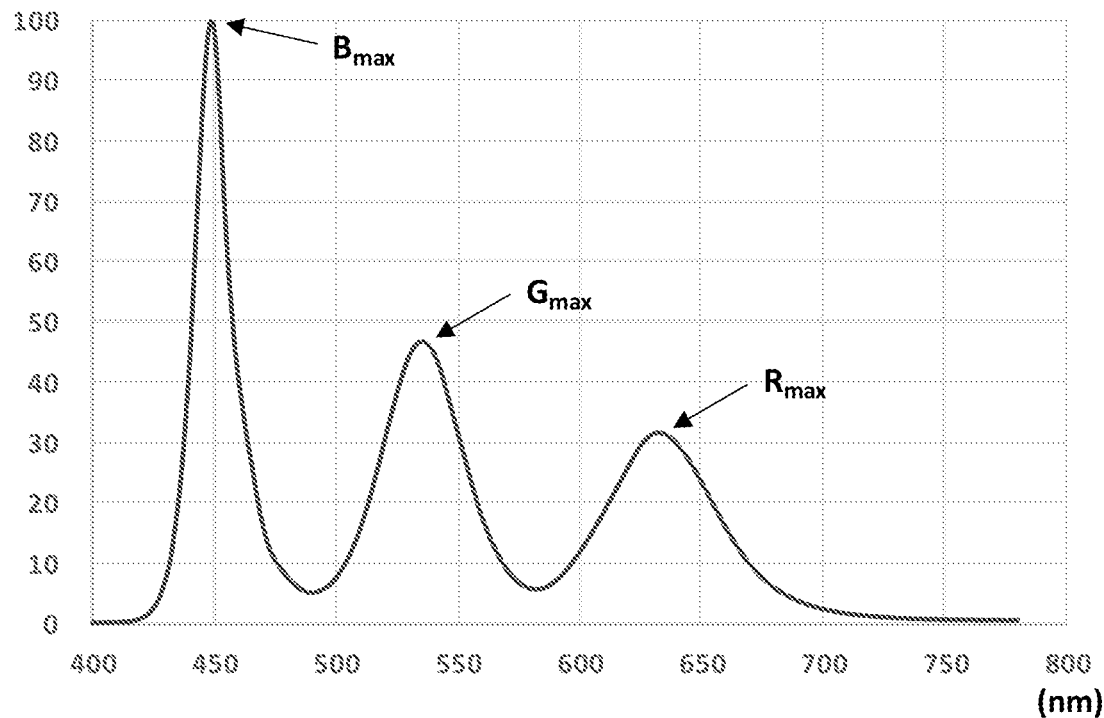
[FIG. 6]
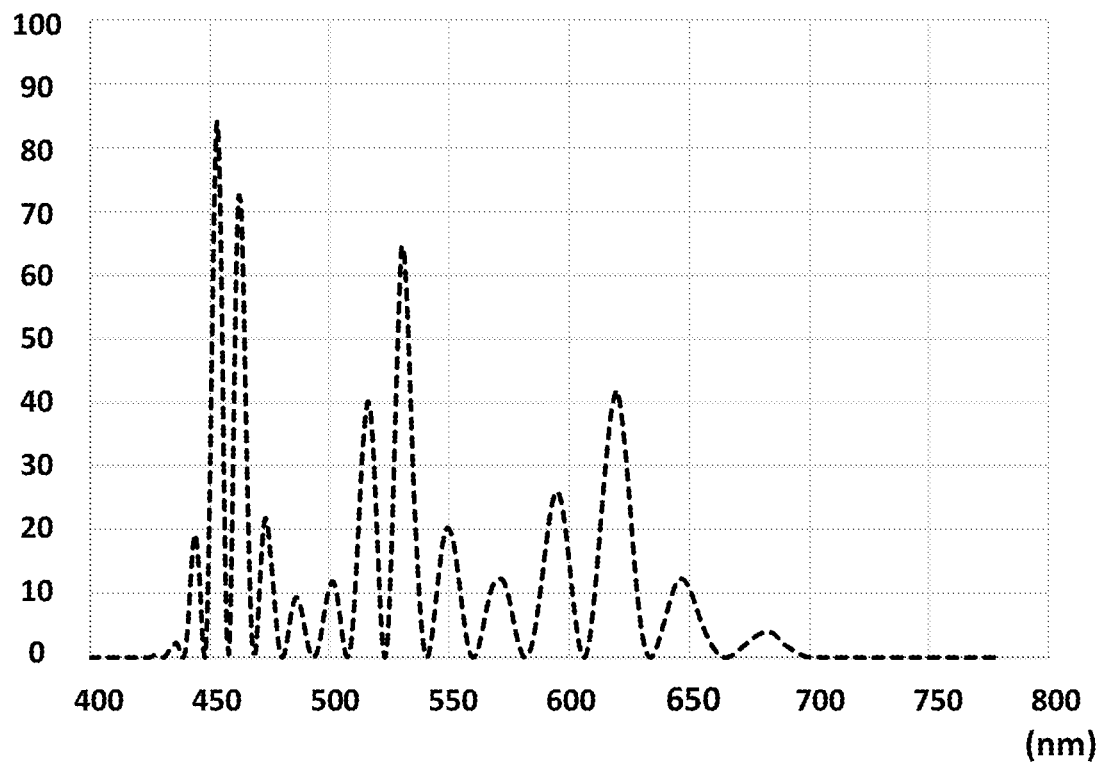

[FIG. 7]
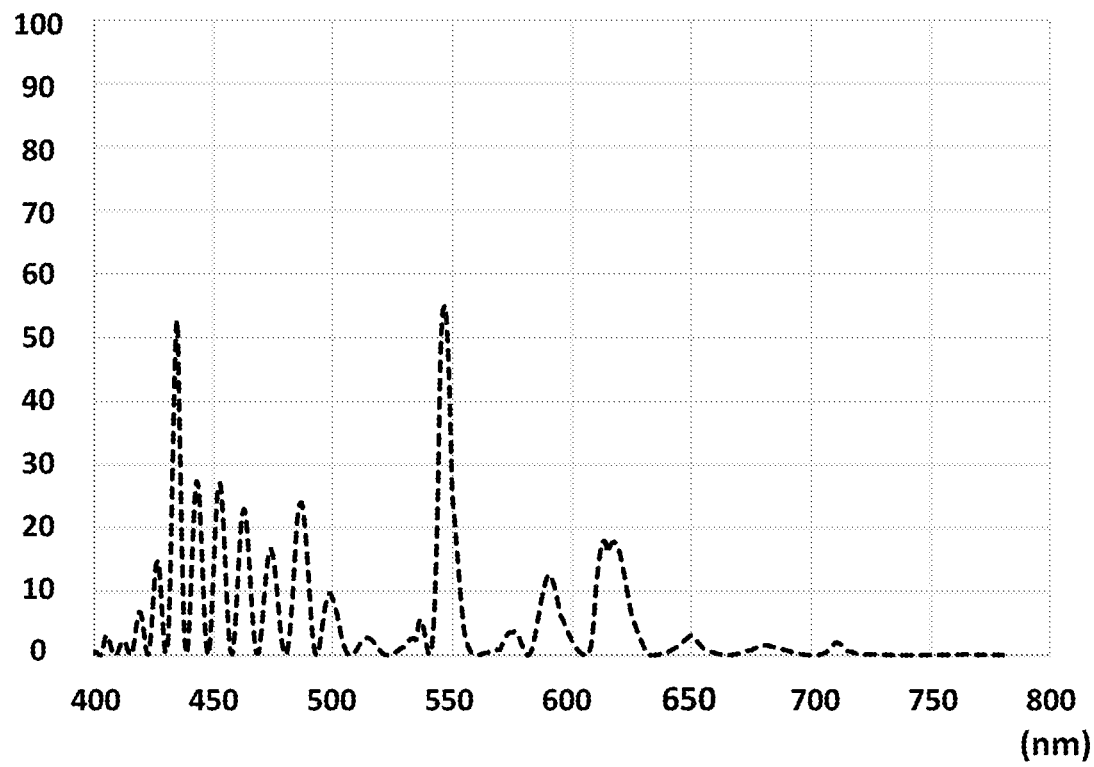
[FIG. 8]
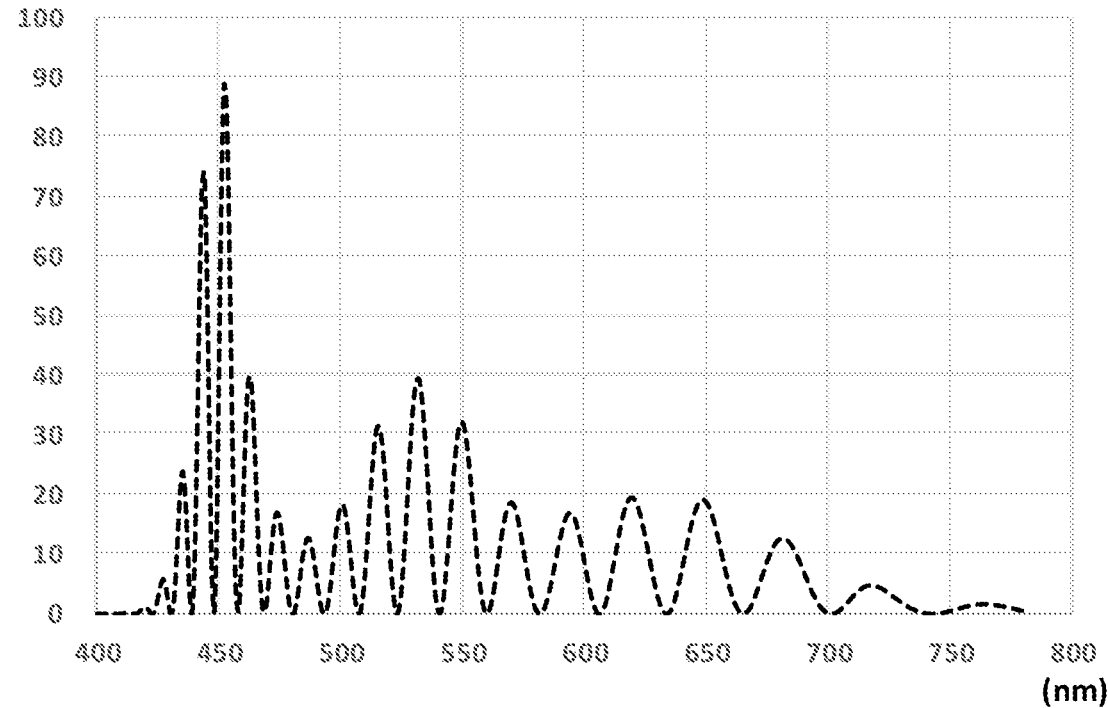

[FIG. 9]
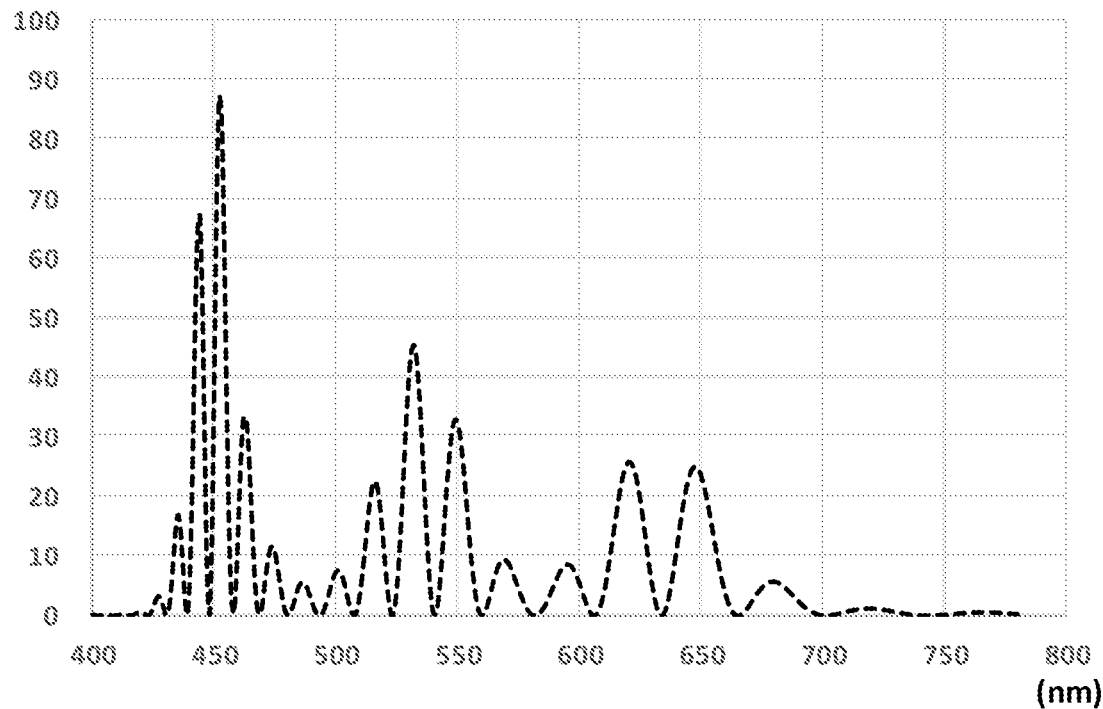
[FIG. 10]
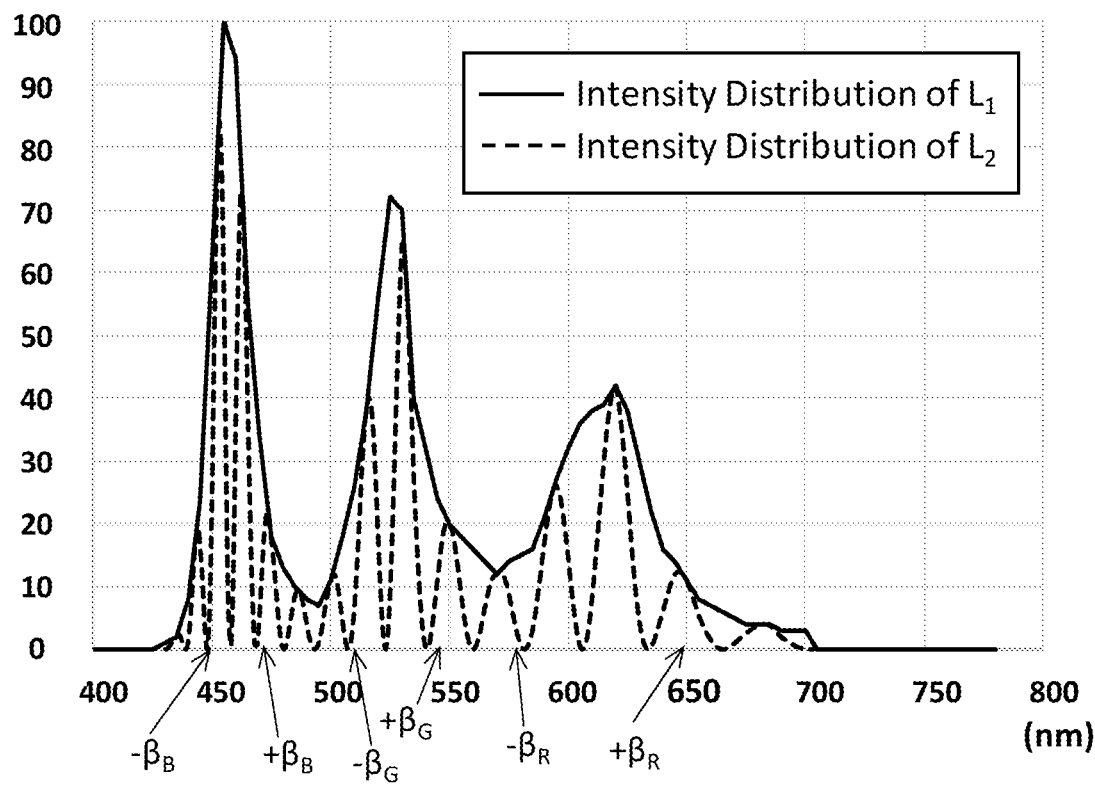

[FIG. 11]
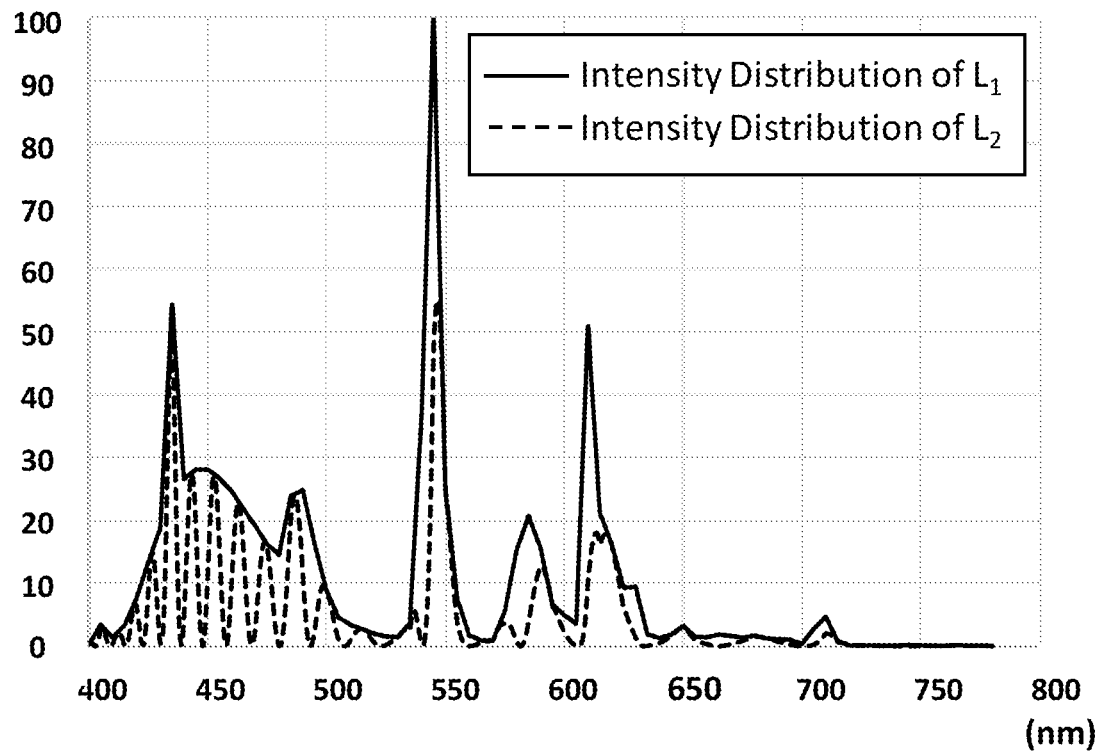
[FIG. 12]
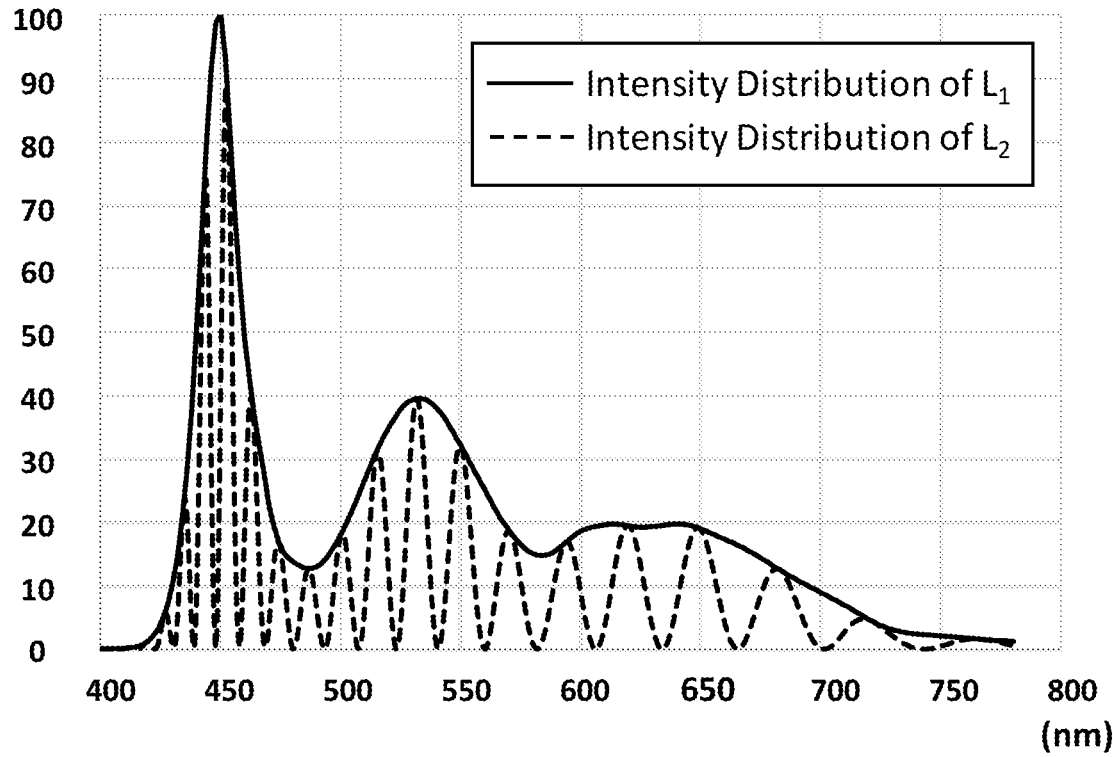

[FIG. 13]
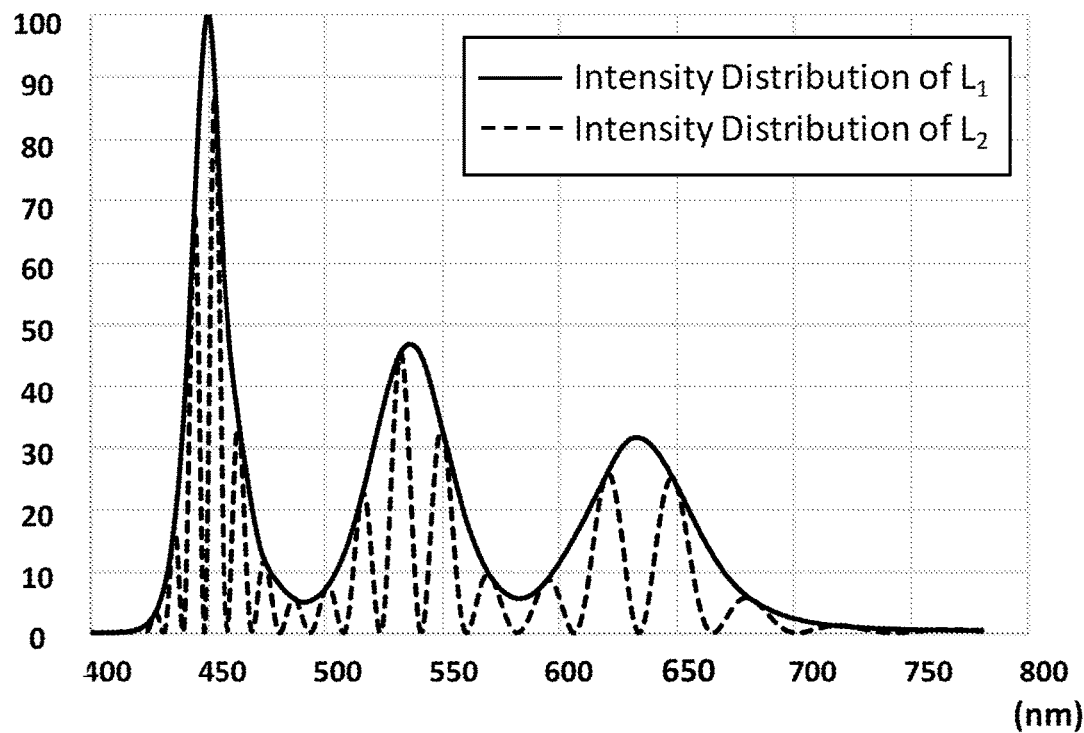
[FIG. 14]
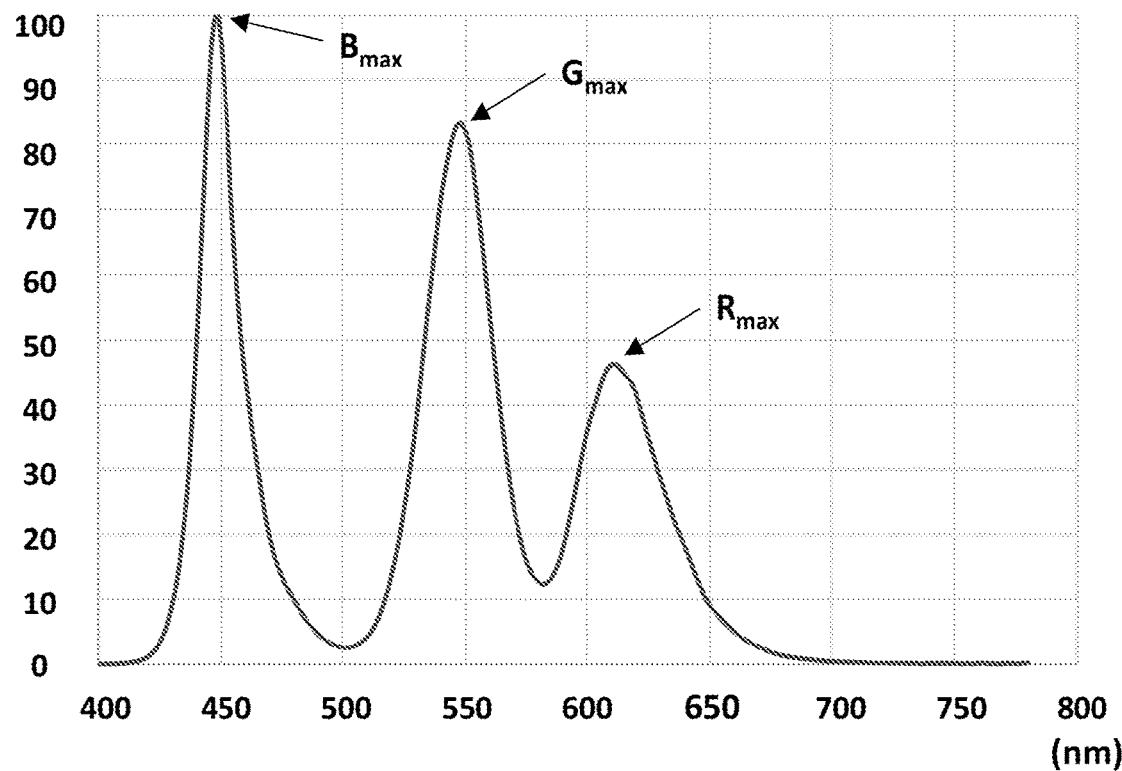

DISPLAY DEVICE AND METHOD FOR SELECTING OPTICAL FILM OF DISPLAY DEVICE

TECHNICAL FIELD

The present invention relates to a display device and a method of selecting an optical film of the display device.

BACKGROUND ART

In display devices represented by liquid crystal display devices, the performance, such as luminance, resolution, and a color gamut, is rapidly progressing. Additionally, in proportion to the progress in the performance, display devices assuming the outdoor use, such as personal digital assistants and car navigation systems, are increasing.

In environments such as an outdoor environment with strong sunlight, there are cases where display devices are observed through sunglasses (hereinafter referred to as "the polarized sunglasses") having a polarizing function in order to reduce the glare.

When a display device includes a polarization plate, there is a problem (hereinafter referred to as "the blackout") that a screen becomes dark and hard to see when the absorption axis of polarization of the display device becomes orthogonal to the absorption axis of polarization of the polarized sunglasses.

In order to solve the above-mentioned problem, the means of PTL1 has been proposed.

CITATION LIST

Patent Literature

PTL1: JP 2011-107198 A

SUMMARY OF INVENTION

Technical Problem

PTL1 is characterized by arranging a polymer film having a 3000 to 30000 nm retardation at a specific angle on the visual recognition side of a polarization plate in a liquid crystal display device using a white light emitting diode (white LED) as a backlight source. The problem of the blackout can be solved by the means of PTL1.

Additionally, in PTL1, the interference color (rainbow unevenness) peculiar to a retardation value is prevented in the liquid crystal display device using a white light emitting diode (white LED) as a backlight source.

On the other hand, recently, in order to improve luminance, resolution, a color gamut, etc., the light sources and display elements of display devices have been diversified. For example, as the light source of the backlight of a liquid crystal display device, a white LED, which is used in PTL1, is widely used. However, recently, liquid crystal display devices are beginning to be proposed that use a quantum dot as the light source of the backlight. Additionally, though the mainstream of the present display element is a liquid crystal display element, the utilization of an organic EL element is spreading recently.

When these recent display devices are observed through the polarized sunglasses, even if the above-mentioned problems (the blackout and the rainbow unevenness) do not occur, another problem may take place in the color reproducibility.

The present invention aims to provide a display device having a good color reproducibility, and a method of selecting an optical sheet of the display device.

Solution to Problem

In order to solve the above-mentioned problems, the inventors focused on the difference between the liquid crystal display device using the white LED, which was the conventional mainstream, and the display device, which is currently under development. As a result, it was found that, compared with the liquid crystal display devices using white LEDs, the recent display devices have a sharper optical spectrum of RGB and a wider color gamut (the width of a reproducible color), and that, due to the wide color gamut, a problem tends to occur in the color reproducibility when light passes through an optical film having a retardation and the absorption axis of polarization.

Additionally, as a result of further study by the inventors, it was found that, in the display devices having a wide color gamut, the longer the wavelength becomes, the color reproducibility problem is more likely to occur, and that mere consideration of the optical spectrum of a light source as in PTL1 cannot solve the problem, and it is necessary to consider the optical spectrum of a display element, which resulted in solving the above-mentioned problems.

The present invention provides a display device and a method of selecting an optical film of the display device as follows.

[1] A display device including a polarizer a and an optical film X on a surface on a light emitting surface side of a display element, and satisfying the condition 1-1 and the condition 2-1 as follows:

<Condition 1-1>

Let $L_1$ represent the light incident vertically on the optical film X, among light incident on the optical film X from the display element side. The intensity of the $L_1$ is measured every 1 nm. It is assumed that the blue wavelength band range from 400 nm to less than 500 nm, the green wavelength band range from 500 nm to less than 600 nm, and the red wavelength band range from 600 nm to 780 nm. Let $B_{max}$ represent the maximum intensity of the blue wavelength band of the $L_1$, $G_{max}$ represent the maximum intensity of the green wavelength band of the $L_1$, and $R_{max}$ represent the maximum intensity of the red wavelength band of the $L_1$.

Let $L_1\lambda_B$ represent the wavelength showing the $B_{max}$, $L_1\lambda_G$ represent the wavelength showing the $G_{max}$, and $L_1\lambda_R$ represent the wavelength showing the $R_{max}$.

Let $+\alpha_B$ represent the minimum wavelength showing a ½ or less of the intensity of the $B_{max}$, and located in the plus direction side of $L_1\lambda_B$, $-\alpha_G$ represent the maximum wavelength showing a ½ or less of the intensity of the $G_{max}$, and located in the minus direction side of $L_1\lambda_G$, $+\alpha_G$ represent the minimum wavelength showing a ½ or less of the intensity of the $G_{max}$, and located in the plus direction side of $L_1\lambda_G$, and $-\alpha_R$ represent the maximum wavelength showing a ½ or less of the intensity of the $R_{max}$, and located in the minus direction side of $L_1\lambda_R$.

$L_1\lambda_B$, $L_1\lambda_G$, $L_1\lambda_R$, $+\alpha_B$, $-\alpha_G$, $+\alpha_G$ and $-\alpha_R$ satisfy the following relationships (1) to (4).

$$+\alpha_B < L_1\lambda_G \quad (1)$$

$$L_1\lambda_B < -\alpha_G \quad (2)$$

$$+\alpha_G < L_1\lambda_R \quad (3)$$

$$L_1\lambda_G < -\alpha_R \quad (4)$$

<Condition 2-1>

Let $L_2$ represent the light that emits vertically from the light emitting surface side of the optical film X, and passes through a polarizer b having the absorption axis parallel to the absorption axis of the polarizer a. The intensity of the $L_2$ is measured every 1 nm. The wavelength at which the inclination of the optical spectrum of the $L_2$ changes from negative to positive is assumed to be a bottom wavelength, and the wavelength at which the inclination of the optical spectrum of the $L_2$ switches from positive to negative is assumed to be a peak wavelength.

Let $-\beta_R$ represent the maximum wavelength showing a ⅓ or less of the intensity of the $R_{max}$, and located in the minus direction side of $L_1\lambda_R$, and $+\beta_R$ represent the minimum wavelength showing a ⅓ or less of the intensity of the $R_{max}$, and located in the plus direction side of $L_1\lambda_R$.

A wavelength band ranging from $-\beta_R$ to $+\beta_R$ in the range of 600 nm to 780 nm includes one or more bottom wavelengths and one or more peak wavelengths.

[2] A method of selecting an optical film of a display device including a polarizer a and the optical film on a surface on a light emitting surface side of a display element, wherein, when incident light being incident on the optical film satisfies the above condition 1-1, the optical film satisfying the above condition 2-1 is selected.

Advantageous Effects of Invention

The display device of the present invention can suppress the reduction of the color reproducibility when observed through the polarized sunglasses. Additionally, the method of selecting the optical film of the display device of the present invention can efficiently select the optical film that can suppress the reduction of the color reproducibility when observed through the polarized sunglasses.

BRIEF DESCRIPTION OF DRAWINGS

FIG. 1 is a cross-sectional view showing one embodiment of a display device of the present invention.

FIG. 2 is an example of an optical spectrum of light ($L_1$) incident on an optical film from the display element side in a display device that includes a polarizer a and the optical film on a three-color independent type organic EL display element having a micro-cavity structure.

FIG. 3 is an example of an optical spectrum of light ($L_1$) incident on an optical film from the display element side in a display device in which a display element is a liquid crystal display element, a light source of a backlight is a cold cathode fluorescent tube (CCFL), and that includes a polarizer a and the optical film on the display element.

FIG. 4 is an example of an optical spectrum of light ($L_1$) incident on an optical film from the display element side in a display device in which a display element is a liquid crystal display element, a light source of a backlight is a white LED, and that includes a polarizer a and the optical film on the display element.

FIG. 5 is an example of an optical spectrum of light ($L_1$) incident on an optical film from the display element side in a display device in which a display element is a liquid crystal display element, a primary light source of a backlight is a blue LED, a secondary light source is a quantum dot, and that includes a polarizer a and the optical film on the display element.

FIG. 6 is an example of an optical spectrum of light ($L_2$) that is emitted from an optical film of a display device that includes a polarizer a and the optical film on a three-color independent type organic EL display element having a micro-cavity structure, and passes through a polarizer b having the absorption axis parallel to the absorption axis of the polarizer a.

FIG. 7 is an example of an optical spectrum of light ($L_2$) that is emitted from an optical film of a display device in which a display element is a liquid crystal display element, a light source of a backlight is a cold cathode fluorescent tube (CCFL), and that includes a polarizer a and the optical film on the liquid crystal display element, and passes through a polarizer b having the absorption axis parallel to the absorption axis of the polarizer a.

FIG. 8 is an example of an optical spectrum of light ($L_2$) that is emitted from an optical film of a display device in which a display element is a liquid crystal display element, a light source of a backlight is a white LED, and that includes a polarizer a and the optical film on the liquid crystal display element, and passes through a polarizer b having the absorption axis parallel to the absorption axis of the polarizer a.

FIG. 9 is an example of an optical spectrum of light ($L_2$) that is emitted from an optical film of a display device in which a display element is a liquid crystal display element, a primary light source of a backlight is a blue LED, a secondary light source is a quantum dot, and that includes a polarizer a and the optical film on the display element, and passes through a polarizer b having the absorption axis parallel to the absorption axis of the polarizer a.

FIG. 10 is a diagram in which the optical spectrum of FIG. 2 and the optical spectrum of FIG. 6 are superimposed on each other.

FIG. 11 is a diagram in which the optical spectrum of FIG. 3 and the optical spectrum of FIG. 7 are superimposed on each other.

FIG. 12 is a diagram in which the optical spectrum of FIG. 4 and the optical spectrum of FIG. 8 are superimposed on each other.

FIG. 13 is a diagram in which the optical spectrum of FIG. 5 and the optical spectrum of FIG. 9 are superimposed on each other.

FIG. 14 is another example of an optical spectrum of light ($L_1$) incident on an optical film from the display element side in a display device in which a display element is a liquid crystal display element, a primary light source of a backlight is a blue LED, a secondary light source is a quantum dot, and that includes a polarizer a and the optical film on the display element.

DESCRIPTION OF EMBODIMENTS

Hereinafter, embodiments of the present invention are described.

[Display Device]

A display device of the present invention includes a polarizer a and an optical film X on a surface on the light emitting surface side of a display element, and satisfies the following conditions 1-1 and 2-1.

<Condition 1-1>

Let $L_1$ represent the light incident vertically on the optical film X, among light incident on the optical film X from the display element side. The intensity of the $L_1$ is measured every 1 nm. It is assumed that the blue wavelength band range from 400 nm to less than 500 nm, the green wavelength band range from 500 nm to less than 600 nm, and the red wavelength band range from 600 nm to 780 nm. Let $B_{max}$ represent the maximum intensity of the blue wavelength band of the $L_1$, $G_{max}$ represent the maximum intensity of the green wavelength band of the $L_1$, and $R_{max}$ represent the maximum intensity of the red wavelength band of the $L_1$.

Let $L_1\lambda_B$ represent the wavelength showing the $B_{max}$, $L_1\lambda_G$ represent the wavelength showing the $G_{max}$, and $L_1\lambda_R$ represent the wavelength showing the $R_{max}$.

Let $+\alpha_B$ represent the minimum wavelength showing a ½ or less of the intensity of the $B_{max}$, and located in the plus direction side of $L_1\lambda_B$, $-\alpha_G$ represent the maximum wavelength showing a ½ or less of the intensity of the $G_{max}$, and located in the minus direction side of $L_1\lambda_G$, $+\alpha_G$ represent the minimum wavelength showing a ½ or less of the intensity of the $G_{max}$, and located in the plus direction side of $L_1\lambda_G$, and $-\alpha_R$ represent the maximum wavelength showing a ½ or less of the intensity of the $R_{max}$, and located in the minus direction side of $L_1\lambda_R$.

$L_1\lambda_B$, $L_1\lambda_G$, $L_1\lambda_R$, $+\alpha_B$, $-\alpha_G$, $+\alpha_G$ and $-\alpha_R$ satisfy the following relationships (1) to (4).

$$+\alpha_B < L_1\lambda_G \quad (1)$$

$$L_1\lambda_B < -\alpha_G \quad (2)$$

$$+\alpha_G < L_1\lambda_R \quad (3)$$

$$L_1\lambda_G < -\alpha_R \quad (4)$$

<Condition 2-1>

Let $L_2$ represent the light that emits vertically from the light emitting surface side of the optical film X, and passes through a polarizer b having the absorption axis parallel to the absorption axis of the polarizer a. The intensity of the $L_2$ is measured every 1 nm. The wavelength at which the inclination of the optical spectrum of the $L_2$ changes from negative to positive is assumed to be a bottom wavelength, and the wavelength at which the inclination of the optical spectrum of the $L_2$ switches from positive to negative is assumed to be a peak wavelength.

Let $-\beta_R$ represent the maximum wavelength showing a ⅓ or less of the intensity of the $R_{max}$, and located in the minus direction side of $L_1\lambda_R$, and $+\beta_R$ represent the minimum wavelength showing a ⅓ or less of the intensity of the $R_{max}$, and located in the plus direction side of $L_1\lambda_R$.

A wavelength band ranging from $-\beta_R$ to $+\beta_R$ in the range of 600 nm to 780 nm includes one or more bottom wavelengths and one or more peak wavelengths.

FIG. 1 is a cross-sectional view showing an embodiment of a display device of the present invention. A display device (100) of FIG. 1 includes a polarizer a (40) and an optical film X (20) on a light emitting surface of a display element (10). In the display device (100) of FIG. 1, an organic EL display element (10a) is used as the display element. Additionally, the display device (100) of FIG. 1 has another optical film (30) provided between the polarizer a (40) and the optical film X (20).

Further, though the other optical film (30) is provided between the polarizer a (40) and the optical film X (20) in FIG. 1, the position of the other optical film (30) may be between the display element and the polarizer a, or may be closer to an observer than the optical film X. Additionally, when the display element of the display device is a liquid crystal display element, a backlight, which is not shown, is required behind the liquid crystal display element.

(Condition 1-1)

The condition 1-1 is a condition indicating that the optical spectrum of RGB (red, green, blue) of the display device is sharp. The condition 1-1 will be described in more detail, referring to the drawings.

FIG. 2 is an example of the optical spectrum at the time of measuring the intensity of light ($L_1$) incident vertically on an optical film from the display element side every 1 nm, when a display element outputs white light, in a display device that includes a polarizer a and the optical film on a three-color independent type organic EL display element having a micro-cavity structure. Further, in the optical spectrum of FIG. 2, the intensity of each wavelength is standardized by setting the maximum intensity to 100.

In FIG. 2, $B_{max}$ indicates the maximum intensity in a blue wavelength band (from 400 nm or more to less than 500 nm), $G_{max}$ indicates the maximum intensity in a green wavelength band (from 500 nm or more to less than 600 nm), and $R_{max}$ indicates the maximum intensity in a red wavelength band (from 600 nm or more to 780 nm or less).

Additionally, in FIG. 2, $L_1\lambda_B$ indicates the wavelength showing $B_{max}$, $L_1\lambda_G$ indicates the wavelength showing $G_{max}$, and $L_1\lambda_R$ indicates the wavelength showing $R_{max}$.

In addition, in FIG. 2, $+\alpha_B$ indicates the minimum wavelength that shows a ½ or less of the intensity of $B_{max}$, and is located on the plus direction side of $L_1\lambda_B$. $-\alpha_G$ indicates the maximum wavelength that shows a ½ or less of the intensity of $G_{max}$, and is located on the minus direction side of $L_1\lambda_G$. $+\alpha_G$ indicates the minimum wavelength that shows a ½ or less of the intensity of $G_{max}$, and is located on the plus direction side of $L_1\lambda_G$. $-\alpha_R$ indicates the maximum wavelength that shows a ½ or less of the intensity of $R_{max}$, and is located on the minus direction side of $L_1\lambda_R$.

In the optical spectrum of FIG. 2, each spectrum of RGB is sharp, and $L_1\lambda_B$, $L_1\lambda_G$, $L_1\lambda_R$, $+\alpha_B$, $-\alpha_G$, $+\alpha_G$ and $-\alpha_R$ satisfy the following relationships (1) to (4).

$$+\alpha_B < L_1\lambda_G \quad (1)$$

$$L_1\lambda_B < -\alpha_G \quad (2)$$

$$+\alpha_G < L_1\lambda_R \quad (3)$$

$$L_1\lambda_G < -\alpha_R \quad (4)$$

FIG. 3 is an example of the optical spectrum at the time of measuring the intensity of light ($L_1$) incident vertically on an optical film from the display element side every 1 nm, when a display element outputs white light, in a display device in which the display element is a liquid crystal display element, a light source of a backlight is a cold cathode fluorescent tube (CCFL), and that includes a polarizer a and the optical film on the display element. Also in FIG. 3, each optical spectrum of RGB is sharp, and satisfies the above-mentioned relationships (1) to (4). Further, in the optical spectrum of FIG. 3, the intensity of each wavelength is standardized by setting the maximum intensity to 100.

FIG. 4 is an example of an optical spectrum of light ($L_1$) incident vertically on an optical film from the display element side, when a display element outputs white light, in a display device in which the display element is a liquid crystal display element, a light source of a backlight is a white LED, and that includes a polarizer a and the optical film on the display element. In FIG. 4, the optical spectrum of B (blue) is sharp, and the optical spectrum of G (green) is comparatively sharp. Therefore, though the above-mentioned relationships (1) to (3) are satisfied, the above-mentioned relationship (4) is not satisfied, since the optical spectrum of R (red) is broad. Further, in the optical spectrum of FIG. 4, the intensity of each wavelength is standardized by setting the maximum intensity to 100.

FIG. 5 is an example of an optical spectrum at the time of measuring the intensity of light ($L_1$) incident vertically on an optical film from the display element side every 1 nm, when a display element outputs white light, in a display device in which the display element is a liquid crystal display element, a primary light source of a backlight is a blue LED, a secondary light source is a quantum dot, and that includes a polarizer a and the optical film on the display element. Also in FIG. 5, each optical spectrum of RGB is sharp, and satisfies the above-mentioned relationships (1) to (4). Further, in the optical spectrum of FIG. 5, the intensity of each wavelength is standardized by setting the maximum intensity to 100.

Next, the relationship between the optical spectrum of RGB and the width of color gamut is described.

The color gamut that can be reproduced by mixing three colors of RGB is shown by a triangle on a CIE-xy chromaticity diagram. The triangle defines the apex coordinates of each color of RGB, and is formed by connecting each apex. In the CIE-xy chromaticity diagram, when each optical spectrum of RGB is sharp, as for the apex coordinates of R, the value of x becomes large and the value of y becomes small, as for the apex coordinates of G, the value of x becomes small and the value of y becomes large, and as for the apex coordinates of B, the value of x becomes small and the value of y becomes small. That is, when each optical spectrum of RGB is sharp, the area of the triangle made by connecting the apex coordinates of each of the RGB colors in the CIE-xy chromaticity diagram becomes large, and the width of a reproducible color gamut becomes wide. Further, widening the width of color gamut leads to the improvement of impressiveness and sense of presence of a moving image.

As a standard for representing the color gamut, there is "ITU-R Recommendation BT. 2020 (hereinafter referred to as "BT. 2020")" etc. ITU-R is the abbreviation for "International Telecommunication Union-Radiocommunication Sector", and ITU-R Recommendation BT. 2020 is an international standard for the color gamut of Super Hi-Vision. When the cover rate of BT. 2020 based on the CIE-xy chromaticity diagram represented by the following formula is within a range described later, it is possible to more easily improve the impressiveness and sense of presence of a moving image.

<The Formula Representing the Cover Rate of BT. 2020>

[The overlapping area in the area of the CIE-$xy$ chromaticity diagram of $L_1$ with the area of the CIE-$xy$ chromaticity diagram of $BT.$ 2020/the area of the CIE-$xy$ chromaticity diagram of $BT.$ 2020]×100(%)

Next, the problem of the color reproducibility is described.

In a display device having a wide color gamut satisfying the condition 1-1, when an image is observed through the polarized sunglasses, the problem of the color reproducibility (especially, the problem of the color reproducibility caused by red) tends to occur. It seems that this is because the cycle of change of the intensity of the optical spectrum of $L_2$ becomes large, due to the influence of the retardation value and the wavelength dependency of the birefringence index of the optical film.

FIGS. 6 to 9 are optical spectra of light ($L_2$) that is obtained by causing $L_1$, having the optical spectra of FIGS. 2 to 5, to enter an optical film, having a retardation value: 11,000 nm, so as to emit vertically from the light emitting surface side of the optical film, and to pass through a polarizer b having the absorption axis parallel to the absorption axis of the polarizer a. The optical spectrum of $L_2$ can be considered as an optical spectrum that is visually recognized through the polarized sunglasses. Referring to the optical spectra of FIGS. 6 to 9, the larger the wavelength becomes, the larger the cycle of change of the intensity of the optical spectrum of $L_2$ becomes. Further, in the optical spectra of $L_2$ in FIGS. 6 to 9, the intensity of each wavelength is standardized by setting the maximum intensity of the optical spectra of $L_1$ to 100. Additionally, $L_2$ in FIGS. 6 to 9 is the light of P polarization (the polarization in the vertical direction with respect to the optical film X).

FIG. 10 is a diagram in which FIG. 2 and FIG. 6 are superimposed on each other, FIG. 11 is a diagram in which FIG. 3 and FIG. 7 are superimposed on each other, FIG. 12 is a diagram in which FIG. 4 and FIG. 8 are superimposed on each other, and FIG. 13 is a diagram in which FIG. 5 and FIG. 9 are superimposed on each other.

$L_1$ in FIG. 12 does not satisfy the condition 1-1. In FIG. 12, much of the optical spectrum of $L_2$ is included in the optical spectrum of $L_1$. That is, as shown in FIG. 12, when the optical spectrum of $L_1$ is not sharp, the problem of the color reproducibility hardly occurs, since a big difference is hardly produced between the optical spectrum of $L_1$ and the optical spectrum of $L_2$, though the color gamut is narrow.

On the other hand, as shown in FIGS. 10, 11 and 13, when the optical spectrum of $L_1$ is sharp, the problem of the color reproducibility easily occurs, since the optical spectrum of $L_2$ is hardly included in the optical spectrum of $L_1$. Especially, in the red (R) wavelength band, the optical spectrum of $L_2$ is hardly included in the optical spectrum of $L_1$. This is because the cycle of change of the intensity of the optical spectrum of $L_2$ becomes large with the increase in the wavelength, due to the influence of the retardation value and the wavelength dependency of the birefringence index, etc. of the optical film.

In the present invention, it is preferable that the optical spectra of $L_1$ and $L_2$ be the optical spectra at the time of causing the display element to output white light. These optical spectra can be measured by using a spectrophotometer. At the time of measurement, the photodetector of the spectrophotometer is placed to be perpendicular to the light emitting surface of the display device, and the viewing angle is set to 1 degree. Additionally, it is preferable that the light to be measured be the light passing through the center of an effective display area of the display device. The optical spectra can be measured by a spectroradiometer CS-2000 made by KONICA MINOLTA, INC., for example.

In addition, "the area of the CIE-xy chromaticity diagram of $L_1$", which is needed when the cover rate of BT. 2020 is calculated, can be calculated by measuring the x values and the y values of the CIE-Yxy color system at the time of outputing red (R) light, green (G) light, and blue (B) light, respectively, and using "the apex coordinates of red (R)", "the apex coordinates of green (G)", and "the apex coordinates of blue (B)", which are obtained from the measurement results. The x value and the y value of the CIE-Yxy color system can be measured by a spectroradiometer CS-2000 made by KONICA MINOLTA, INC., for example. (Condition 2-1)

The condition 2-1 represents the condition for preventing the problem of the color reproducibility from being produced.

Further, in the condition 2-1, "the polarizer b" substantially means "the polarizer of the polarized sunglasses". That is, in the condition 2, "the light ($L_2$) that emits vertically from the optical film X, and passes through a polarizer b having the absorption axis parallel to the absorption axis of the polarizer a" means "the light that emits from the optical film X, and passes through the polarizer of the polarized sunglasses (the light recognized by a human through the polarized sunglasses)".

Additionally, in the condition 2-1, the definition as "a wavelength band ranging from $-\beta_R$ to $+\beta_R$ in the range of 600 nm to 780 nm" means that, for the wavelength band of less than 600 nm or more than 780 nm, even if this wavelength is in a range from $-\beta_R$ to $+\beta_R$, the bottom wavelength and the peak wavelength are not counted.

The solid line in FIG. 10 corresponds to that in FIG. 2, and the broken line in FIG. 10 corresponds to that in FIG. 6.

In FIG. 10, $-\beta_R$ indicates the maximum wavelength showing a ⅓ or less of the intensity of $R_{max}$, and is located in the minus direction side of $L_1\lambda_R$. Additionally, in FIG. 10, $+\beta_R$ indicates the minimum wavelength showing a ⅓ or less of the intensity of $R_{max}$, and is located in the plus direction side of $L_1\lambda_R$.

When the wavelength at which the inclination of the optical spectrum of $L_2$ changes from negative to positive is assumed to be the bottom wavelength, and the wavelength at which the inclination of the optical spectrum of $L_2$ switches from positive to negative is assumed to be the peak wavelength, the broken line in FIG. 10 includes one or more bottom wavelengths and one or more peak wavelengths in a wavelength band ranging from $-\beta_R$ to $+\beta_R$ in the range of 600 nm to 780 nm, and satisfies the condition 2-1.

When the condition 2-1 is satisfied, it means that one or more crests of the wavelength band of the red (R) of $L_2$ are included in the crest near the maximum intensity of the red (R) of $L_1$. That is, when the condition 2-1 is satisfied, it is possible to suppress the problem of the color reproducibility due to red (R), since there is less difference between the optical spectrum of the wavelength band of the red (R) of $L_1$, and the optical spectrum of the wavelength band of the red (R) of $L_2$.

On the other hand, when the condition 2-1 is not satisfied, it means that no crest of the wavelength band of the red (R) of $L_2$ is included in the crest near the maximum intensity of the red (R) of $L_1$. For this reason, when the condition 2-1 is not satisfied, the color reproducibility is deteriorated due to the red (R).

In the wavelength band of the red (R) of $L_2$, while red (R) is high next to green (G) with respect to human visibility, the cycle of the optical spectrum becomes long due to the wavelength dispersion property of the retardation. For this reason, when the optical spectrum of $L_1$ is sharp, the condition 2-1 cannot be satisfied with a usual design, and the color reproducibility is deteriorated due to red (R) of which human visibility is high. The present invention enables the suppression of deterioration of the color reproducibility in consideration of the wavelength dispersion property of the retardation (especially, the wavelength dispersion property of the retardation influenced by the wavelength dependency of the birefringence index).

Further, in the liquid crystal display device using the white LED as the light source of the backlight, which was conventionally the mainstream, the optical spectrum of the red (R) of $L_1$ is broad as shown in FIG. 4. Therefore, the crest of the wavelength band of the red (R) of $L_2$ can be easily included in the crest near the maximum intensity of the red (R) of $L_1$. That is, the deterioration of the color reproducibility due to red (R) during observation through the polarized sunglasses is a problem that cannot occur in the liquid crystal display device using the white LED, which was the conventional mainstream.

In the condition 2-1, $L_2$ is polarized, and may be P polarization or may be S polarization. Further, many of the usual polarized sunglasses cut S polarization. For this reason, it is preferable that the condition 2-1 be satisfied when $L_2$ is P polarization.

In the condition 2-1, it is preferable that a wavelength band ranging from $-\beta_R$ to $+\beta_R$ in the range of 600 nm to 780 nm include two or more above-mentioned bottom wavelengths and two or more above-mentioned peak wavelengths.

Additionally, it is preferable for the display device of the present invention to satisfy one or more of the following conditions 2-2 to 2-4, in order to suppress the problem of the color reproducibility more. By satisfying one or more of the conditions 2-2 to 2-4, it is possible to suppress the deterioration of the color reproducibility due to red (R) even more.

<Condition 2-2>

0.40≤[the total intensity of the $L_2$ in the wavelength band ranging from $-\beta_R$ to $+\beta_R$ in the range of 600 nm to 780 nm/the total intensity of the $L_1$ in the wavelength band ranging from $-\beta_R$ to $+\beta_R$ in the range of 600 nm to 780 nm]

Regarding the condition 2-2, it is more preferable to satisfy 0.45≤the right-hand side, and it is still more preferable to satisfy 0.47≤the right-hand side.

Further, in the condition 2-2, the definition as "the wavelength band ranging from $-\beta_R$ to $+\beta_R$ in the range of 600 nm to 780 nm" means that the wavelength band of less than 600 nm or more than 780 nm is not used for obtaining the total intensity, even if this wavelength band ranges from $-\beta_R$ to $+\beta_R$.

In the condition 2-2 and the condition 2-4 described below, it is preferable that the total intensity of $L_1$ and $L_2$ be calculated by assuming the angle θ between the absorption axis (the vibrating direction of linear polarization) of the polarizer of polarizer a and the slow axis of the optical film X to be 45 degrees.

<Condition 2-3>

Let $-\alpha_R$ represent the maximum wavelength showing a ½ or less of the intensity of the $R_{max}$, and located in the minus direction side of $L_1\lambda_R$, and $+\alpha_R$ represent the minimum wavelength showing a ½ or less of the intensity of the $R_{max}$, and located in the plus direction side of $L_1\lambda_R$.

A wavelength band ranging from $-\alpha_R$ to $+\alpha_R$ in the range of 600 nm to 780 nm includes one or more above-mentioned bottom wavelengths of the $L_2$ and one or more peak wavelengths of the $L_2$.

Further, in the condition 2-3, the definition as "a wavelength band ranging from $-\alpha_R$ to $+\alpha_R$ in the range of 600 nm to 780 nm" means that, for the wavelength band of less than 600 nm or more than 780 nm, even if this wavelength band is in a range from $-\alpha_R$ to $+\alpha_R$, the bottom wavelength and the peak wavelength are not counted.

In the conditions 2-3, it is more preferable that a wavelength band ranging from $-\alpha_R$ to $+\alpha_R$ in the range of 600 nm to 780 nm include two or more above-mentioned bottom wavelengths and two or more above-mentioned peak wavelengths.

<Condition 2-4>

0.40≤[the total intensity of the $L_2$ in the wavelength band ranging from $-\alpha_R$ to $+\alpha_R$ in the range of 600 nm to 780 nm/the total intensity of the $L_1$ in the wavelength band ranging from $-\alpha_R$ to $+\alpha_R$ in the range of 600 nm to 780 nm]

Regarding the condition 2-4, it is more preferable to satisfy 0.45≤the right-hand side, and it is still more preferable to satisfy 0.47≤the right-hand side.

Further, in the condition 2-4, the definition as "the wavelength band ranging from $-\alpha_R$ to $+\alpha_R$ in the range of 600 nm to 780 nm" means that the wavelength band of less than 600 nm or more than 780 nm is not used for obtaining the total intensity, even if this wavelength band is in a range from $-\alpha_R$ to $+\alpha_R$.

The conditions 2-1 to 2-4 are the conditions for the wavelength band of the red (R) of $L_2$. For this reason, it is preferable to satisfy the conditions similar to the conditions 2-1 to 2-4, also in the wavelength bands of the green (G) and blue (B) of $L_2$. Further, as described above, the shorter the wavelength becomes, the shorter the cycle of the optical spectrum becomes, due to the influence of the retardation value, and the wavelength dependency of the birefringence index of the optical film, etc. Therefore, usually, when the conditions 2-1 to 2-4 are satisfied, the similar conditions are also satisfied in the wavelength bands of the green (G) and blue (B).

(Preferable Mode of $L_1$)

As described above, in the display device of the present invention, though the problem of the color reproducibility tends to occur with a usual design, since the condition 1-1 (the optical spectrum of $L_1$ is sharp) is satisfied, the problem of the color reproducibility is suppressed by satisfying the condition 2-1.

Additionally, in the display device of the present invention, even if the optical spectrum of $L_1$ is very sharp, when the condition 2-1 is satisfied, it is possible to suppress the problem of the color reproducibility. Recently, in order to extend the color gamut, display devices have been developed in which the optical spectrum of $L_1$ becomes very sharp. The display device of the present invention is preferable in that it is possible to suppress the problem of the color reproducibility, even in display devices having a very sharp optical spectrum of $L_1$.

For example, the display device of the present invention is preferable in that it is possible to suppress the problem of the color reproducibility for the display device satisfying one or more of the following condition 1-2 to the condition 1-5 (the display device having a very sharp optical spectrum of $L_1$, and having a very wide color gamut). The conditions 1-1 to 1-4 mainly contribute to expansion of the color gamut by increasing the color purity, and the condition 1-5 mainly contributes to the expansion of the color gamut in consideration of brightness.

Further, it becomes easy to suppress the rainbow unevenness by satisfying the condition 1-2.

<Condition 1-2>

Based on the optical spectrum of $L_1$ obtained by the measurement of the condition 1-1, an average value $B_{Ave}$ of the intensities of the optical spectra in the blue wavelength band, an average value $G_{Ave}$ of the intensities of the optical spectra in the green wavelength band, and an average value $R_{Ave}$ of the intensities of the optical spectra in the red wavelength band are calculated. Let $B_p$ represent the wavelength band in which the intensities of $L_1$ continuously exceed $B_{Ave}$ in the blue wavelength band, $G_p$ represent the wavelength band in which the intensities of $L_1$ continuously exceed $G_{Ave}$ in the green wavelength band, and $R_p$ represent the wavelength band in which the intensities of $L_1$ continuously exceed $R_{Ave}$ in the red wavelength band. The numbers of wavelength bands indicating $B_p$, $G_p$ and $R_p$ are all 1.

In the optical spectra of FIGS. 2, 4 and 5, the numbers of wavelength bands indicating $B_p$, $G_p$ and $R_p$ are all 1, and the condition 1-2 is satisfied. On the other hand, in the optical spectrum of FIG. 3, there are two wavelength bands for each of $B_p$ and $G_p$, and the condition 1-2 is not satisfied.

<Condition 1-3>

The above-mentioned $+\alpha_B$, the above-mentioned $-\alpha_G$, the above-mentioned $+\alpha_G$, and the above-mentioned $-\alpha_R$ satisfy the following relationships (5) to (6).

$$+\alpha_B < -\alpha_G \quad (5)$$

$$+\alpha_G < -\alpha_R \quad (6)$$

The optical spectra of FIGS. 2, 3 and 5 satisfy the relationships (5) and (6), and satisfy the condition 1-3. On the other hand, the optical spectrum of FIG. 4 does not satisfy the relationship (6), and does not satisfy the condition 1-3.

<Condition 1-4>

Let $+\beta_B$ represent the minimum wavelength showing a ⅓ or less of the intensity of the $B_{max}$, and located in the plus direction side of $L_1\lambda_B$, $-\beta_G$ represent the maximum wavelength showing a ⅓ or less of the intensity of the $G_{max}$, and located in the minus direction side of $L_1\lambda_G$, $+\beta_G$ represent the minimum wavelength showing a ⅓ or less of the intensity of the $G_{max}$, and located in the plus direction side of $L_1\lambda_G$, and $-\beta_R$ represent the maximum wavelength showing a ⅓ or less of the intensity of the $R_{max}$, and located in the minus direction side of $L_1\lambda_R$.

The above-mentioned $+\beta_B$, the above-mentioned $-\beta_G$, the above-mentioned $+\beta_G$, and the above-mentioned $-\beta_R$ satisfy the following relationships (7) to (8).

$$+\beta_B < -\beta_G \quad (7)$$

$$+\beta_G < -\beta_R \quad (8)$$

The optical spectra of FIGS. 2, 3 and 5 each satisfy the relationships (7) and (8), and satisfy the condition 1-4. On the other hand, the optical spectrum of FIG. 4 does not satisfy the relationship (8), and does not satisfy the condition 1-4.

<Condition 1-5>

Let $L_{1max}$ represent the maximum intensity among the above-mentioned $B_{max}$, the above-mentioned $G_{max}$, and the above-mentioned $R_{max}$. $B_{max}/L_{1max}$, $G_{max}/L_{1max}$, and $R_{max}/L_{1max}$ are each 0.27 or more.

In the optical spectra of FIGS. 2, 3 and 5, $B_{max}/L_{1max}$, $G_{max}/L_{1max}$, and $R_{max}/L_{1max}$ are each 0.27 or more, and the condition 1-5 is satisfied. On the other hand, in the optical spectrum of FIG. 4, $R_{max}/L_{1max}$ is each less than 0.27, and the condition 1-5 is not satisfied.

In the condition 1-5, it is more preferable that $B_{max}/L_{1max}$, $G_{max}/L_{1max}$, and $R_{max}/L_{1max}$ are each 0.30 or more.

Further, while it is preferable that the optical spectrum of $L_1$ be sharp from the viewpoint of extending the color gamut, it is preferable that the optical spectrum of $L_1$ be not extremely sharp from the viewpoint of easily satisfying the condition 2-1. For this reason, the difference between the above-mentioned $+\beta_R$ and the above-mentioned $-\beta_R$ [$+\beta_R-(-\beta_R)$] is preferably 15 to 90 nm, more preferably 30 to 85 nm, and still more preferably 50 to 80 nm.

Additionally, for the balance between the viewpoint of extending the color gamut and the viewpoint of easily satisfying the condition 2-3, the difference between the above-mentioned $+\alpha_R$ and the above-mentioned $-\alpha_R$ [$+\alpha_R-(-\alpha_R)$] is preferably 10 to 70 nm, more preferably 20 to 60 nm, and still more preferably 30 to 55 nm.

As display devices having a very sharp optical spectrum of $L_1$, there are a three-color independent type organic EL display device, a liquid crystal display device using a quantum dot for a backlight, etc.

(Display Element)

As display elements, there are a liquid crystal display element, an organic EL display element, an inorganic EL display element, a plasma display element, etc. Further, the liquid crystal display element may be an in-cell touch-panel liquid crystal display element provided with a touch-panel function in the element.

Among these display elements, in the three-color independent type organic EL display element, the optical spectrum of $L_1$ easily becomes sharp, and the effect of the present invention is effectively demonstrated. However, in organic EL display elements, there is a problem of the optical extraction efficiency. Thus, in order to improve the optical extraction efficiency, three-color independent type organic EL elements are provided with a micro-cavity structure. In the three-color independent type organic EL elements provided with this micro-cavity structure, the optical spectrum of $L_1$ tends to become sharper as the optical extraction efficiency is more improved, and the effect of the present invention is effectively demonstrated.

Additionally, when the display element is a liquid crystal display element, and a quantum dot is used as a backlight, the optical spectrum of $L_1$ easily becomes sharp, and the effect of the present invention is effectively demonstrated.

As for the display element, the cover rate of BT. 2020 based on the CIE-xy chromaticity diagram represented by the above-mentioned formula is preferably 60% or more, and more preferably 65% or more.

(Polarizer a)

The polarizer a is placed on the emitting surface of the display element, and is located closer to the display element than the optical film X.

As polarizers a, there are, for example, a polyvinyl alcohol film dyed with iodine etc. and oriented, a sheet-type polarizer such as a polyvinyl-formal film, a polyvinyl-acetal film, and an ethylene-vinyl acetate copolymer based saponificated film, a wire grid type polarizer composed of many metal wires arranged in parallel, a coating type polarizer to which a lyotropic liquid crystal or a dichroic guest-host material is applied, a multilayer thin film type polarizer, etc. Further, these polarizers a may be reflection-type polarizers provided with the function of reflecting the polarization component that is not transmitted.

It is preferable to cover both sides of the polarizer a with a transparent protective plate, such as a plastic film and glass. It is also possible to use the optical film X as the transparent protective plate.

The polarizer a is used, for example, in order to add an antireflection property by combination with a ¼λ plate. Additionally, when the display element is a liquid crystal display element, a backside polarizer is provided on the light entering surface side of the liquid crystal display element, and is used for adding the function of a liquid crystal shutter by arranging the absorption axis of the polarizer a located on the upper side of the liquid crystal display element to be orthogonal to the absorption axis of the backside polarizer.

In principle, the polarized sunglasses absorb the S polarization. Thus, in principle, the direction of the absorption axis of the polarizer of the polarized sunglasses is also horizontal. For this reason, it is preferable to provide the polarizer a such that the angle of the direction of the absorption axis of the polarizer a is within the range less than ±10 degrees with respect to the horizontal direction of the display device. It is more preferable that the angle be within the range less than ±5 degrees.

When there are two or more polarizers between the display element and the optical film X, the polarizer located farthest from the display element is assumed to be the polarizer a.

(Optical Film X)

The optical film X is on a surface on the light emitting surface side of the display element, and is provided farther from the light emitting surface than the polarizer a. Additionally, when the display device includes a plurality of polarizers, the optical film X is provided farther from the light emitting surface than the polarizer (the polarizer a) located farthest from the light emitting surface.

When a plurality of optical films is provided on the display element, it is preferable to provide the optical film X farthest from the display element (on the viewer side).

The optical film X has a role of changing the light before it transmits through the optical film X, and making the relationship between $L_1$ and $L_2$ satisfy the condition 2-1.

Let "$I_0$" represent the intensity of $L_1$ incident vertically on the optical film X, "$Re_{550}$" represent the retardation value of a wavelength of 550 nm of the optical film X, "$N(\lambda)$" represent [the birefringence index of the material forming the optical film X with respect to each of wavelengths ranging from 400 to 780 nm/the birefringence index of the material forming the optical film X with respect to the wavelength of 550 nm], and "θ" represent the angle formed between the absorption axis (the vibrating direction of linear polarization) of polarizer of the polarizer a and the slow axis of the optical film X. In this case, the intensity I of the light ($L_2$) that emits vertically from the light emitting surface side of the optical film X, and passes through the polarizer b having the absorption axis parallel to the absorption axis of the polarizer a can be represented by the following formula (A). Further, it is assumed that $L_1$ is the linear polarization that passes through the polarizer a located closer to the display element than the optical film X.

$$I = I_0 - I_0 \cdot \sin^2(2\theta) \cdot \sin^2(\pi \cdot N(\lambda) \cdot Re_{550}/\lambda) \tag{A}$$

The configuration of the optical film X can be determined based on the above formula (A). Specifically, first, the optical spectrum of $L_1$ before being transmitted through the optical film X is measured. Then, based on the measurement result of the optical spectrum of $L_1$ and the above formula (A), the simulation is performed for the optical spectrum of $L_2$ in accordance with the retardation value of the optical film X. Then, the optical spectrum of $L_1$ is compared with the optical spectrum of $L_2$ obtained in the simulation, and the optical film having the retardation that satisfies the condition 2-1 is determined as the optical film X. By determining the configuration of the optical film X in this manner, it is possible to achieve a good color reproducibility, without increasing the retardation of the optical film X more than necessary.

Further, the value of I shows the maximum value when the angle θ formed between the absorption axis (the vibrating direction of linear polarization) of polarizer of the polarizer a and the slow axis of the optical film X is 45 degrees. For this reason, it is preferable to perform the above simulation with the following formula (B) assuming θ to be 45 degrees.

$$I = I_0 - I_0 \cdot \sin^2(\pi \cdot N(\lambda) \cdot Re_{550}/\lambda) \tag{B}$$

When a plurality of optical films is provided on the display element, as described above, it is preferable to provide the optical film X farthest from the display element (the viewer side). In this case, the above simulation may be performed by the interaction between the optical film X and the optical film located closer to the display element than optical film X. For example, in a case where the slow axis direction of the optical film X is arranged to be the same as the slow axis direction of the optical film located closer to the display element than the optical film X, when both of the optical films are formed from the same material, the above simulation can be performed by calculating $Re_{550}$ based on the total thickness of both of the optical films.

When the retardation value of the optical film X is increased, it becomes easy to satisfy the condition 2-1. However, a mere increase of the retardation value may not satisfy the condition 2-1. Additionally, when the retardation value of the optical film X is too large, the thickness of the optical film X may become too large, or it may be necessary to use a special material having a bad handleability as the material of the optical film X. In addition, when the retardation value is too small, when observed through the polarized sunglasses, the blackout or the rainbow unevenness may easily occur.

For this reason, it is preferable to use the optical film X that satisfies the condition 2-1 in the range from 3,000 nm to 100,000 nm for the retardation value. The retardation value of the optical film X more preferably ranges from 4,000 nm to 30,000 nm, still more preferably ranges from 5,000 nm to 20,000 nm, still further preferably ranges from 6,000 nm to 15,000 nm, and especially preferably ranges from 7,000 nm to 12,000 nm. Further, the retardation value herein is a retardation value at the wavelength of 550 nm.

The retardation value of the optical film X is represented by the following formula (C) by using a refractive index $n_x$ in the slow axis direction, which is the direction having the largest refractive index in the surface of the optical film, a refractive index $n_y$ in the fast axis direction, which is the direction orthogonal to the above-mentioned slow-axis direction in the surface of an optically transparent film, and a thickness d of the optical film.

$$\text{Retardation Value}(Re)=(n_x-n_y)\times d \quad (C)$$

The above retardation value can be measured by "KOBRA-WR" and "PAM-UHR100" that are product names and made by Oji Scientific Instruments Co., Ltd., for example.

Additionally, after the orientation axis direction (the direction of the main axis) of the optical film X is obtained using two or more polarizers, the refractive index $(n_x, n_y)$ of the two axes (the refractive index of the oriented axis, and the axis orthogonal to the orientation axis) is obtained with an Abbe refractive-index meter (NAR-4T, made by ATAGO CO., LTD). Here, the axis showing a larger refractive index is defined as the slow axis. The thickness d of the optical film is measured with, for example, a micrometer (the brand name: Digimatic Micrometer, made by Mitutoyo Corporation), and the unit is converted to nm. The retardation may also be calculated from the product of the birefringence index $(n_x-n_y)$ and the thickness d of the film (nm).

As for the optical film X, there is the optical film X mainly formed from an optically transparent base material, such as a plastic film.

As the optically transparent base materials, there are oriented plastic films, such as a polyester film, a polycarbonate film, a cycloolefin polymer film, and an acrylic film. Among these, from the viewpoint of being easy to increase the birefringence index, a oriented polyester film and a oriented polycarbonate film are preferable. Additionally, among the optically transparent base materials, those exhibiting the positive dispersion property (the property in which the shorter the wavelength becomes, the larger the birefringence index becomes) are preferable. Especially, the polyester film that is oriented (the oriented polyester film) has a strong positive dispersion property, and has the property in which the shorter the wavelength becomes, the larger the birefringence index becomes (the longer the wavelength becomes, the smaller the birefringence index becomes). Therefore, even if the retardation value is equivalent to those of the other plastic films, the oriented polyester film is preferable in that the above condition 2-1 can be easily satisfied. In other words, it is preferable to use the oriented polyester film as the base material of the optical film X, since the above condition 2-1 can be easily satisfied without increasing the thickness of the base material more than necessary.

As the polyester film, a polyethylene terephthalate film (PET film), a polyethylene naphthalate film (PEN film), etc. are preferred.

As for the orienting, there are longitudinal uniaxial orienting, tenter orienting, successive biaxial orienting, and simultaneous biaxial orienting, etc.

Additionally, among the optically transparent base materials, those exhibiting a positive birefringence property are preferable from the viewpoint of mechanical strength. The optically transparent base material exhibiting a positive birefringence property means an optically transparent base material in which a refractive index $n_1$ of the orientation axis direction (the direction of the main axis) of the optically transparent base material, and a refractive index $n_2$ of the direction orthogonal to the orientation axis direction satisfy the relationship of $n_1>n_2$. As the optically transparent base material exhibiting a positive birefringence property, there are polyester films, such as a PET film and a PEN film, aramid films, etc.

From the viewpoints of handleability and reduction of film thickness, the thickness of the optically transparent base material preferably ranges from 5 to 300 μm, more preferably ranges from 10 to 200 μm, and still more preferably ranges from 15 to 100 μm.

The optical film X may include a function layer on the optically transparent base material. As the functional layer, there are a hard coat layer, an anti-glare layer, an antireflection layer, an antistatic layer, an antifouling layer, etc.

(Other Optical Films)

The display device of the present invention may include other optical films, such as a phase difference film, a hard coat film, and a gas barrier film. Further, it is more preferable that the other optical films be provided closer to the display element than the optical film X.

(Touch Panel)

The display device of the present invention may be a display device with a touch panel, in which the touch pane is provide between the display element and the optical film X. Although the positional relationship between the polarizer a and the touch panel on the display element is not particularly limited, it is preferable to arrange the polarizer (the polarizer a) located farthest from the light emitting surface between the touch panel and the optical film X.

As the touch panel, there are a resistance film type touch panel, a capacitance type touch panel, an in-cell touch panel, an electromagnetic induction type touch panel, an optical touch panel, an ultrasonic type touch panel, etc.

(Backlight)

When the display device is a liquid crystal display device, a backlight is disposed behind the display element.

As the backlight, any of an edge light type backlight and a directly under type backlight can be used.

As the light source of the backlight, there are an LED, a CCFL, etc. However, in the backlight using a quantum dot as the light source, the optical spectrum of $L_1$ easily becomes sharp, and the effect of the present invention is effectively demonstrated.

The backlight using a quantum dot as the light source includes at least a primary light source that emits primary light, and a secondary light source composed of the quantum dot that absorbs the primary light and emits secondary light.

When the primary light source emits the primary light having a wavelength corresponding to blue, it is preferable that the quantum dot, which is the secondary light source, include at least one of a first quantum dot that absorbs the primary light and emits the secondary light having a wavelength corresponding to red, and a second quantum dot that absorbs the primary light and emits the secondary light having a wavelength corresponding to green, and it is more preferable that the quantum dot include both of the above-mentioned first quantum dot and the above-mentioned second quantum dot.

A quantum dot is a nanometer-sized semiconductor particle, exhibits specific optical and electric properties by the quantum confinement effect (the quantum size effect) with which electrons and excitons are confined in a nanometer-sized small crystal, and is also called a semiconductor nanoparticle and a semiconductor nanocrystal.

The material of the quantum dot is not particularly limited as long as the material is a nanometer-sized semiconductor particle, and produces the quantum confinement effect (the quantum size effect).

Quantum dots may be contained in the optical film that constitutes the backlight.

[Method of Selecting Optical Film of Display Device]

A method of selecting the optical film of the display device of the present invention is a method of selecting the optical film of the display device including the polarizer a and the optical film on a surface on the light emitting surface side of the display element, and when the light incident on the optical film satisfies the above condition 1-1, the method selects the optical film that satisfies the above condition 2-1.

The optical spectra of $L_1$ and $L_2$ can be measured by using a spectrophotometer. At the time of measurement, the photodetector of the spectrophotometer is placed to be perpendicular to the light emitting surface of the display device, and the viewing angle is set to 1 degree. Additionally, it is preferable that the light to be measured be the light passing through the center of the effective display area of the display device. Further, it is preferable to calculate the optical spectrum of $L_2$ based on a simulation as described later.

It is preferable that the optical film satisfying the conditions 2-1 to 2-4 be selected by the following procedures (a) and (b).

(a) Based on the measurement result of the optical spectrum of $L_1$ measured in the condition 1-1, and the above formula (A), the optical spectrum of $L_2$ in accordance with the retardation value of the optical film X is calculated by the simulation. Further, instead of the above formula (A), the above formula (B) may be used.

(b) The optical spectrum of $L_1$ is compared with the optical spectrum of $L_2$ calculated by the simulation, and the optical film having the retardation that satisfies the condition 2-1 is selected as the optical film X.

According to the method of selecting the optical film of the display device of the present invention, it is possible to efficiently select the optical film that can suppress the deterioration of the color reproducibility during observation through the polarized sunglasses, and to improve the working efficiency.

The method of selecting the optical film of the display device of the present invention is especially effective when the optical spectrum of $L_1$ is very sharp. Specifically, when the optical spectrum of $L_1$ satisfies the above-mentioned conditions 1-2 to 1-5, since the problem of the color reproducibility are more aggravated, the method of selecting the optical film of the display device of the present invention is very useful.

Additionally, from the viewpoint of making the color reproducibility better, it is preferable for the method of selecting the optical film of the display device of the present invention to have one or more conditions that are chosen from the above-mentioned conditions 2-2 to 2-4, and it is more preferable to have all of the above-mentioned conditions 2-2 to 2-4.

EXAMPLE

Next, the present invention is described in more detail with examples. However, the present invention is not limited in any way by these examples. Further, "part" and "%" are based on a mass basis, unless otherwise specified.

1. Fabrication of Optical Film

An non-oriented film was fabricated by melting polyethylene terephthalate at 290° C., causing the polyethylene terephthalate to pass through a film forming die to be extruded in a sheet-like shape, and cooling the polyethylene terephthalate by pressing the polyethylene terephthalate on a rotating quenching drum that was water-cooled. This non-oriented film was preheated for 1 minute at 120° C. in a biaxial orient test apparatus (TOYO SEIKI Co., Ltd), and was thereafter subjected to a fixed-end uniaxial orienting of 4.0 times at 120° C., to fabricate the optical film having a birefringence property in a surface. The refractive indices are $n_x=1.701$ and $n_y=1.6015$, and the difference between them is $\Delta n=0.0995$ at a wavelength of 550 nm.

The film thickness of this optical film was adjusted, and optical films i to vii having the following retardation values (Re) were obtained.

optical film i: Re=3,000 nm
optical film i: Re=4,000 nm
optical film iii: Re=6,000 nm
optical film iv: Re=7,000 nm
optical film v: Re=8,000 nm
optical film vi: Re=11,000 nm
optical film vii: Re=15,000 nm 2. Measurement of Optical Spectrum of $L_1$ The intensity of light ($L_1$) incident vertically on the optical film from the display element side was measured every 1 nm by using a spectrophotometer while the viewing angle was set to 1 degree, when the following display devices A to E outputted white light. In the display devices A to E, the angle formed between the absorption axis (the vibrating direction of linear polarization) of the polarizer a and the slow axis of the optical film X was set to 45 degrees. Additionally, the measurement position was the center of the effective display area of the display device. FIG. 2 shows the optical spectrum of $L_1$ of the display device A, FIG. 3 shows the optical spectrum of $L_1$ of the display device B, FIG. 4 shows the optical spectrum of $L_1$ of the display device C, FIG. 5 shows the optical spectrum of $L_1$ of the display device D, and FIG. 14 shows the optical spectrum of $L_1$ of the display device E. In addition, the numerical values about the conditions 1-1 to 1-5 calculated based on the measurement results are shown in Table 1. Additionally, those that satisfies the conditions 1-1 to 1-5 are indicated by "◯", those that does not satisfy them are indicated by "x", and both of them are also shown in Table 1.

<Display Device A>

A commercially available display device including the polarizer a and the optical film on the three-color independent type organic EL display element having a micro-cavity structure. The cover rate of BT. 2020 based on the CIE-xy chromaticity diagram: 77%.

<Display Device B>

A commercially available display device in which the display element is a liquid crystal display element with a color filter, and the light source of the backlight is a cold cathode fluorescent tube (CCFL), and that includes the polarizer a and the optical film on the display element.

<Display Device C>

A commercially available display device in which the display element is a liquid crystal display element with a color filter, and the light source of the backlight is a white LED, and that includes the polarizer a and the optical film on the display element. The cover rate of BT. 2020 based on the CIE-xy chromaticity diagram: 49%.

<Display Device D (Display Device 1 Using Quantum Dot)>

A commercially available display device in which the display element is a liquid crystal display element with a color filter, the primary light source of the backlight is a blue LED, and the secondary light source is a quantum dot, and that includes the polarizer a and the optical film on the display element. The cover rate of BT. 2020 based on the CIE-xy chromaticity diagram: 68%.

<Display Device E (Display Device 2 Using Quantum Dot)>

A commercially available display device in which the display element is a liquid crystal display element with a color filter, the primary light source of the backlight is a blue LED, and the secondary light source is a quantum dot, and that includes the polarizer a and the optical film on the display element. The cover rate of BT. 2020 based on the CIE-xy chromaticity diagram: 52%.

TABLE 1

|  | Display Device A | Display Device B | Display Device C | Display Device D | Display Device E |
|---|---|---|---|---|---|
| $B_{max}$ | 100.0 | 54.3 | 100.0 | 100.0 | 100.0 |
| $G_{max}$ | 72.0 | 100.0 | 39.5 | 46.8 | 83.3 |
| $R_{max}$ | 42.0 | 50.9 | 19.7 | 31.6 | 46.2 |
| $L_{1\lambda B}$ | 455 nm | 435 nm | 450 nm | 449 nm | 448 nm |
| $L_{1\lambda G}$ | 525 nm | 545 nm | 532 nm | 536 nm | 548 nm |
| $L_{1\lambda R}$ | 620 nm | 610 nm | 640 nm | 632 nm | 611 nm |
| $-\alpha_B$ | 448 nm | 431 nm | 436 nm | 441 nm | 440 nm |
| $+\alpha_B$ | 467 nm | 440 nm | 460 nm | 459 nm | 459 nm |
| $-\alpha_G$ | 514 nm | 541 nm | 502 nm | 516 nm | 531 nm |
| $+\alpha_G$ | 538 nm | 549 nm | 568 nm | 556 nm | 564 nm |
| $-\alpha_R$ | 590 nm | 607 nm | 429 nm | 606 nm | 593 nm |
| $+\alpha_R$ | 636 nm | 615 nm | 695 nm | 661 nm | 635 nm |
| $-\beta_B$ | 446 nm | 429 nm | 436 nm | 438 nm | 437 nm |
| $+\beta_B$ | 471 nm | 472 nm | 466 nm | 464 nm | 464 nm |
| $-\beta_G$ | 508 nm | 539 nm | 490 nm | 510 nm | 526 nm |
| $+\beta_G$ | 545 nm | 550 nm | 680 nm | 563 nm | 569 nm |
| $-\beta_R$ | 575 nm | 606 nm | 427 nm | 598 nm | 588 nm |
| $+\beta_R$ | 645 nm | 620 nm | 712 nm | 669 nm | 643 nm |
| Number of Wavelength Bands Indicating $B_p$ | 1 | 2 | 1 | 1 | 1 |
| Number of Wavelength Bands Indicating $G_p$ | 1 | 2 | 1 | 1 | 1 |
| Number of Wavelength Bands Indicating $R_p$ | 1 | 1 | 1 | 1 | 1 |
| Condition 1-1 | ◯ | ◯ | X | ◯ | ◯ |
| Condition 1-2 | ◯ | X | ◯ | ◯ | ◯ |
| Condition 1-3 | ◯ | ◯ | X | ◯ | ◯ |
| Condition 1-4 | ◯ | ◯ | X | ◯ | ◯ |
| Condition 1-5 | ◯ | ◯ | X | ◯ | ◯ |
| Cover Rate of BT. 2020 | 77% | — | 49% | 68% | 52% |

3. Fabrication of Display Devices A-i to A-vii, Display Devices B-i to B-vii, Display Devices C-i to C-vii, Display Devices D-i to D-vii, and Display Devices E-i to E-vii Display devices A-i to A-vii, display devices B-i to B-vii, display devices C-i to C-vii, display devices D-i to D-vii, and display devices E-i to E-vii were obtained by arranging optical films i to vii as the optical film of the display devices A to E.

4. Simulation of $L_2$, and Measurement of Optical Spectrum of $L_2$

Based on the optical spectrum of $L_1$ measured by above 2 and the above formula (B), the intensity I of light ($L_2$) was calculated by simulation. The light ($L_2$) is light that emits vertically from the light emitting surface side of the optical film of the display devices A-i to A-vii, the display devices B-i to B-vii, the display devices C-i to C-vii, the display devices D-i to D-vii, and the display devices E-i to E-vii, and that passes through the polarizer b having the absorption axis parallel to the absorption axis of the polarizer a. The numerical values about the conditions 2-1 to 2-4 calculated based on the simulation results are shown in Tables 2 to 6. Additionally, those that satisfies the conditions 2-1 to 2-4 are indicated by "◯", those that does not satisfy them are indicated by "x", and both of them are also shown in Tables 2 to 6.

Further, the similar results were obtained when the numerical values about the conditions 2-1 to 2-4 were calculated based on actual measurement values.

5. Evaluation

As described below, the display devices A-i to A-vii, the display devices B-i to B-vii, the display devices C-i to C-vii, the display devices D-i to D-vii, and the display devices E-i to E-vii were evaluated. The results are shown in Tables 2 to 6.

5-1. Blackout

The screen of the display device was made white or substantially white. The screen was observed from various angles via the polarized sunglasses, and it was visually evaluated whether there is any part in which the screen becomes dark.

◯: There is no part in which the screen becomes dark.

x: There is a part in which the screen becomes dark.

5-2. Rainbow Unevenness

The screen of the display device was made white or substantially white. The screen was observed from various angles via the polarized sunglasses, and it was visually evaluated whether a rainbow pattern unevenness is visually recognized.

○: A rainbow pattern is not visually recognized.
Δ: A rainbow pattern is slightly visually recognized.
x: A rainbow pattern is visually recognized.

5-3. Color Reproducibility

The screen of the display device was made in color. The screen was observed from the front through the polarized sunglasses (state 1), and through a glass plate dyed the same color as that of the polarized sunglasses placed on the screen without the polarized sunglasses (state 2), and the color reproducibility with polarized sunglasses was visually evaluated.

Given 2 points for the case where the difference of color between the state 1 and the state 2 (the difference of color based on red) is not noticeable, 1 point for the case where the difference of color between the state 1 and the state 2 (the difference of color based on red) is slightly noticeable, and 0 points for the case where the difference of color between the state 1 and the state 2 (the difference of color based on red) is very noticeable, 20 people made evaluations, and the average point was calculated.

⊙: The average point is 1.7 or more
○: The average point ranges from 1.5 to less than 1.7
Δ: The average point ranges from 1.0 to less than 1.5
x: The average point is less than 1.0

5-4. Sense of Presence of Moving Image

The screen of the display device was observed without the polarized sunglasses while the screen displays a color moving image, and the sense of presence of the moving image was visually evaluated.

○: The sense of presence is felt strong.
Δ: The sense of presence is felt.
x: The sense of presence is unsatisfactory.

TABLE 2

|  | Display Device | | | | | | |
|---|---|---|---|---|---|---|---|
|  | A-i | A-ii | A-iii | A-iv | A-v | A-vi | A-vii |
| Number of Bottom Wavelengths of Condition 2-1 | 0 | 0 | 0 | 1 | 1 | 2 | 2 |
| Number of Peak Wavelengths of Condition 2-1 | 0 | 1 | 1 | 1 | 1 | 1 | 2 |
| Condition 2-1 | X | X | X | ○ | ○ | ○ | ○ |
| Right-hand Side of Condition 2-2 | 0.44 | 0.71 | 0.62 | 0.48 | 0.47 | 0.45 | 0.51 |
| Condition 2-2 | ○ | ○ | ○ | ○ | ○ | ○ | ○ |
| Number of Bottom Wavelengths of Condition 2-3 | 0 | 0 | 0 | 1 | 1 | 2 | 1 |
| Number of Peak Wavelengths of Condition 2-3 | 0 | 1 | 1 | 1 | 1 | 1 | 2 |
| Condition 2-3 | X | X | X | ○ | ○ | ○ | ○ |
| Right-hand Side of Condition 2-4 | 0.38 | 0.77 | 0.66 | 0.46 | 0.49 | 0.45 | 0.54 |
| Condition 2-4 | X | ○ | ○ | ○ | ○ | ○ | ○ |
| Blackout | ○ | ○ | ○ | ○ | ○ | ○ | ○ |
| Rainbow Unevenness | X | Δ | ○ | ○ | ○ | ○ | ○ |
| Color Reproducibility | X | X | X | ○ | ○ | ○ | ⊙ |
| Sense of Presence of Moving Image | ○ | ○ | ○ | ○ | ○ | ○ | ○ |

TABLE 3

|  | Display Device | | | | | | |
|---|---|---|---|---|---|---|---|
|  | B-i | B-ii | B-iii | B-iv | B-v | B-vi | B-vii |
| Number of Bottom Wavelengths of Condition 2-1 | 0 | 0 | 0 | 0 | 1 | 1 | 1 |
| Number of Peak Wavelengths of Condition 2-1 | 0 | 1 | 0 | 0 | 0 | 1 | 1 |
| Condition 2-1 | X | X | X | X | X | ○ | ○ |
| Right-hand Side of Condition 2-2 | 0.23 | 0.96 | 0.66 | 0.65 | 0.14 | 0.45 | 0.51 |
| Condition 2-2 | X | ○ | ○ | ○ | X | ○ | ○ |
| Number of Bottom Wavelengths of Condition 2-3 | 0 | 0 | 0 | 0 | 1 | 0 | 0 |
| Number of Peak Wavelengths of Condition 2-3 | 0 | 1 | 0 | 0 | 0 | 0 | 1 |

TABLE 3-continued

|  | Display Device | | | | | | |
|---|---|---|---|---|---|---|---|
|  | B-i | B-ii | B-iii | B-iv | B-v | B-vi | B-vii |
| Condition 2-3 | X | X | X | X | X | X | X |
| Right-hand Side of Condition 2-4 | 0.19 | 0.99 | 0.59 | 0.75 | 0.05 | 0.32 | 0.61 |
| Condition 2-4 | X | ◯ | ◯ | ◯ | X | X | ◯ |
| Blackout | ◯ | ◯ | ◯ | ◯ | ◯ | ◯ | ◯ |
| Rainbow Unevenness | X | X | X | X | X | X | X |
| Color Reproducibility | X | X | X | X | X | Δ | Δ |
| Sense of Presence of Moving Image | Δ | Δ | Δ | Δ | Δ | Δ | Δ |

TABLE 4

|  | Display Device | | | | | | |
|---|---|---|---|---|---|---|---|
|  | C-i | C-ii | C-iii | C-iv | C-v | C-vi | C-vii |
| Number of Bottom Wavelengths of Condition 2-1 | 1 | 1 | 2 | 3 | 2 | 3 | 5 |
| Number of Peak Wavelengths of Condition 2-1 | 1 | 1 | 2 | 3 | 2 | 3 | 5 |
| Condition 2-1 | ◯ | ◯ | ◯ | ◯ | ◯ | ◯ | ◯ |
| Right-hand Side of Condition 2-2 | 0.57 | 0.55 | 0.52 | 0.54 | 0.45 | 0.47 | 0.51 |
| Condition 2-2 | ◯ | ◯ | ◯ | ◯ | ◯ | ◯ | ◯ |
| Number of Bottom Wavelengths of Condition 2-3 | 1 | 1 | 2 | 2 | 2 | 3 | 4 |
| Number of Peak Wavelengths of Condition 2-3 | 1 | 1 | 2 | 2 | 2 | 3 | 4 |
| Condition 2-3 | ◯ | ◯ | ◯ | ◯ | ◯ | ◯ | ◯ |
| Right-hand Side of Condition 2-4 | 0.61 | 0.52 | 0.54 | 0.50 | 0.47 | 0.49 | 0.50 |
| Condition 2-4 | ◯ | ◯ | ◯ | ◯ | ◯ | ◯ | ◯ |
| Blackout | ◯ | ◯ | ◯ | ◯ | ◯ | ◯ | ◯ |
| Rainbow Unevenness | ◯ | ◯ | ◯ | ◯ | ◯ | ◯ | ◯ |
| Color Reproducibility | ◯ | ◯ | ⊙ | ⊙ | ⊙ | ⊙ | ⊙ |
| Sense of Presence of Moving Image | X | X | X | X | X | X | X |

TABLE 5

|  | Display Device | | | | | | |
|---|---|---|---|---|---|---|---|
|  | D-i | D-ii | D-iii | D-iv | D-v | D-vi | D-vii |
| Number of Bottom Wavelengths of Condition 2-1 | 0 | 1 | 1 | 1 | 2 | 3 | 3 |
| Number of Peak Wavelengths of Condition 2-1 | 1 | 1 | 1 | 2 | 1 | 2 | 3 |
| Condition 2-1 | X | ◯ | ◯ | ◯ | ◯ | ◯ | ◯ |
| Right-hand Side of Condition 2-2 | 0.69 | 0.42 | 0.48 | 0.53 | 0.47 | 0.48 | 0.50 |
| Condition 2-2 | ◯ | ◯ | ◯ | ◯ | ◯ | ◯ | ◯ |
| Number of Bottom Wavelengths of Condition 2-3 | 0 | 1 | 1 | 1 | 2 | 2 | 3 |
| Number of Peak Wavelengths of Condition 2-3 | 1 | 1 | 1 | 1 | 1 | 2 | 3 |
| Condition 2-3 | X | ◯ | ◯ | ◯ | ◯ | ◯ | ◯ |
| Right-hand Side of Condition 2-4 | 0.72 | 0.40 | 0.49 | 0.52 | 0.45 | 0.52 | 0.51 |

TABLE 5-continued

| | Display Device | | | | | | |
|---|---|---|---|---|---|---|---|
| | D-i | D-ii | D-iii | D-iv | D-v | D-vi | D-vii |
| Condition 2-4 | ○ | ○ | ○ | ○ | ○ | ○ | ○ |
| Blackout | ○ | ○ | ○ | ○ | ○ | ○ | ○ |
| Rainbow Unevenness | X | Δ | ○ | ○ | ○ | ○ | ○ |
| Color Reproducibility | X | ○ | ○ | ○ | ○ | ⊙ | ⊙ |
| Sense of Presence of Moving Image | ○ | ○ | ○ | ○ | ○ | ○ | ○ |

TABLE 6

| | Display Device | | | | | | |
|---|---|---|---|---|---|---|---|
| | E-i | E-ii | E-iii | E-iv | E-v | E-vi | E-vii |
| Number of Bottom Wavelengths of Condition 2-1 | 0 | 0 | 0 | 1 | 1 | 1 | 2 |
| Number of Peak Wavelengths of Condition 2-1 | 0 | 0 | 1 | 1 | 1 | 1 | 2 |
| Condition 2-1 | X | X | X | ○ | ○ | ○ | ○ |
| Right-hand Side of Condition 2-2 | 0.40 | 0.74 | 0.61 | 0.51 | 0.45 | 0.43 | 0.51 |
| Condition 2-2 | ○ | ○ | ○ | ○ | ○ | ○ | ○ |
| Number of Bottom Wavelengths of Condition 2-3 | 0 | 0 | 0 | 1 | 1 | 2 | 1 |
| Number of Peak Wavelengths of Condition 2-3 | 0 | 0 | 1 | 1 | 1 | 1 | 2 |
| Condition 2-3 | X | X | X | ○ | ○ | ○ | ○ |
| Right-hand Side of Condition 2-4 | 0.35 | 0.80 | 0.64 | 0.49 | 0.45 | 0.44 | 0.55 |
| Condition 2-4 | X | ○ | ○ | ○ | ○ | ○ | ○ |
| Blackout | ○ | ○ | ○ | ○ | ○ | ○ | ○ |
| Rainbow Unevenness | X | Δ | ○ | ○ | ○ | ○ | ○ |
| Color Reproducibility | X | X | X | ○ | ○ | ○ | ⊙ |
| Sense of Presence of Moving Image | Δ | Δ | Δ | Δ | Δ | Δ | Δ |

Referring to the results of Tables 1 to 6, in the display devices satisfying the condition 1-1 and the condition 2-1 (the display devices A-iv to A-vii, the display devices B-vi to B-vii, the display devices D-ii to D-vii, and the display devices E-iv to E-vii), since the color gamut is wide, excellent sense of presence for the moving image was demonstrated, and the problem of the color reproducibility, which tends to occur when the color gamut is wide, could also be suppressed.

Additionally, among the display devices satisfying the condition 1-1 and the condition 2-1, in the display devices further satisfying the conditions 1-2 to 1-5 and having the cover rate of BT. 2020 based on the CIE-xy chromaticity diagram of 60% or more (the display devices A-iv to A-vii, the display devices D-ii to D-vii), more excellent sense of presence for the moving image was demonstrated.

In addition, among the display devices satisfying the condition 1-1 and the condition 2-1, in the display devices whose numbers of bottom wavelength and peak wavelength of the condition 2-3 are each one or more (the display devices A-iv to A-vii, D-ii to D-vii, E-iv to E-vii), more excellent color reproducibility was demonstrated. Among these, in the display devices whose numbers of bottom wavelength and peak wavelength of the condition 2-1 are each two or more (the display devices A-vii, D-vi, D-vii, E-vii), still more excellent color reproducibility was demonstrated.

REFERENCE SIGNS LIST

10: display element
10a: organic EL display element
20: optical film X
30: other optical films
40: polarizer a
100: display device

The invention claimed is:
1. A display device comprising a display element, a polarizer A on a surface on a light emitting surface side of the display element and a plurality of optical films on the polarizer A,
  wherein when the optical film located farthest among the plurality of optical films on the polarizer A from the display element is defined as an optical film X,
  wherein the optical film X is a polyester film having retardation value of 4,000 nm or more,
  wherein the display device satisfies the following Condition 1-1, Condition 2-1, and Condition 2-3:

<Condition 1-1> let $L_1$ represent light incident vertically on the optical film X, among light incident on the optical film X from a display element side; an intensity of the $L_1$ is measured every 1 nm; a blue wavelength band range is from 400 nm to less than 500 nm, a green wavelength band range is from 500 nm to less than 600 nm, and a red wavelength band range is from 600 nm to 780 nm; let $B_{max}$ represent a maximum intensity of the blue wavelength band of the $L_1$, $G_{max}$ represent a maximum intensity of the green wavelength band of the $L_1$, and $R_{max}$ represent a maximum intensity of the red wavelength band of the $L_1$;

let $L_1\lambda_B$ represent a wavelength showing the $B_{max}$, $L_1\lambda_G$ represent a wavelength showing the $G_{max}$, and $L_1\lambda_R$ represent a wavelength showing the $R_{max}$;

let $+\alpha_B$ represent a minimum wavelength showing ½ or less of the intensity of the $B_{max}$, and located in a plus direction side of $L_1\lambda_B$, $-\alpha_G$ represent a maximum wavelength showing ½ or less of the intensity of the $G_{max}$, and located in a minus direction side of $L_1\lambda_G$, $+\alpha_G$ represent a minimum wavelength showing ½ or less of the intensity of the $G_{max}$, and located in a plus direction side of $L_1\lambda_G$, and $-\alpha_R$ represent a maximum wavelength showing ½ or less of the intensity of the $R_{max}$, and located in a minus direction side of $L_1\lambda_R$; and $L_1\lambda_B$, $L_1\lambda_G$, $L_1\lambda_R$, $+\alpha_B$, $-\alpha_G$, $+\alpha_G$ and $-\alpha_R$ satisfy the following relationships (1) to (4), $$+\alpha_B < L_1\lambda_G \quad (1)$$

$$L_1\lambda_B < -\alpha_G \quad (2)$$

$$+\alpha_G < L_1\lambda_R \quad (3)$$

$$L_1\lambda_G < -\alpha_R \quad (4);$$

<Condition 2-1> let $L_2$ represent light that emits vertically from the light emitting surface side of the optical film X, and passes through a polarizer B having an absorption axis parallel to an absorption axis of the polarizer A; an intensity of the $L_2$ is measured every 1 nm; a wavelength at which an inclination of an optical spectrum of the $L_2$ changes from negative to positive is a bottom wavelength, and a wavelength at which the inclination of the optical spectrum of the $L_2$ switches from positive to negative is a peak wavelength;

let $-\beta_R$ represent a maximum wavelength showing ⅓ or less of the intensity of the $R_{max}$, and located in the minus direction side of $L_1\lambda_R$, and $+\beta_R$ represent a minimum wavelength showing ⅓ or less of the intensity of the $R_{max}$, and located in a plus direction side of $L_1\lambda_R$; and a wavelength band ranging from $-\beta_R$ to $+\beta_R$ in the range of 600 nm to 780 nm includes one or more bottom wavelengths and one or more peak wavelengths;

<Condition 2-3> let $-\beta_R$ represent a maximum wavelength showing ½ or less of the intensity of the $R_{max}$, and located in the minus direction side of $L_1\lambda_R$, and $+\alpha_R$ represent a minimum wavelength showing ½ or less of the intensity of the $R_{max}$, and located in the plus direction side of $L_1\lambda_R$; and a wavelength band ranging from $-\alpha_R$ to $+\alpha_R$ in the range of 600 nm to 780 nm includes one or more bottom wavelengths of the $L_2$ and one or more peak wavelengths of the $L_2$, wherein a difference between the $+\alpha_R$ and the $-\alpha_R$ $[+\alpha_R-(-\alpha_R)]$ is 42 to 55 nm.

2. The display device according to claim 1, wherein the following Condition 1-2 is satisfied:

<Condition 1-2> based on an optical spectrum of $L_1$ obtained by the measurement of the condition 1-1, an average value $B_{Ave}$ of intensities of an optical spectrum in the blue wavelength band, an average value $G_{Ave}$ of intensities of an optical spectrum in the green wavelength band, and an average value $R_{Ave}$ of intensities of an optical spectrum in the red wavelength band are calculated; let $B_p$ represent a wavelength band in which the intensities of $L_1$ continuously exceed $B_{Ave}$ in the blue wavelength band, $G_p$ represent a wavelength band in which the intensities of $L_1$ continuously exceed $G_{Ave}$ in the green wavelength band, and $R_p$ represent the wavelength band in which the intensities of $L_1$ continuously exceed $R_{Ave}$ in the red wavelength band; and the numbers of wavelength bands indicating $B_p$, $G_p$ and $R_p$ are all 1.

3. The display device according to claim 1, wherein the following Condition 1-3 is satisfied:

<Condition 1-3> the $+\alpha_B$, the $-\alpha_G$, the $+\alpha_G$ and the $-\alpha_R$ satisfy the following relationships (5) to (6), $$+\alpha_B < -\alpha_G \quad (5)$$

$$+\alpha_G < -\alpha_R \quad (6).$$

4. The display device according to claim 1, wherein the following Condition 1-4 is satisfied:

<Condition 1-4> let $+\beta_B$ represent a minimum wavelength showing ⅓ or less of the intensity of the $B_{max}$, and located in the plus direction side of $L_1\lambda_B$, $-\beta_G$ represent a maximum wavelength showing ⅓ or less of the intensity of the $G_{max}$, and located in the minus direction side of $L_1\lambda_G$, $+\beta_G$ represent a minimum wavelength showing ⅓ or less of the intensity of the $G_{max}$, and located in the plus direction side of $L_1\lambda_G$, and $-\beta_R$ represent a maximum wavelength showing ⅓ or less of the intensity of the $R_{max}$, and located in the minus direction side of $L_1\lambda_R$; and the $+\beta_B$, the $-\beta_G$, the $+\beta_G$ and the $-\beta_R$ satisfy the following relationships (7) to (8), $$+\beta_B < -\beta_G \quad (7)$$

$$+\beta_G < -\beta_R \quad (8).$$

5. The display device according to claim 1, wherein the following Condition 1-5 is satisfied:

<Condition 1-5> let $L_{1max}$ represent the maximum intensity among the $B_{max}$, the $G_{max}$ and $R_{max}$; and $B_{max}/L_{1max}$, $G_{max}/L_{1max}$, and $R_{max}/L_{1max}$ are each 0.27 or more.

6. The display device according to claim 1, wherein the following Condition 2-2 is satisfied:

<Condition 2-2>

0.40≤[a total intensity of the $L_2$ in the wavelength band ranging from $-\beta_R$ to $+\beta_R$ in the range of 600 nm to 780 nm/a total intensity of the $L_1$ in the wavelength band ranging from $-\beta_R$ to $+\beta_R$ in the range of 600 nm to 780 nm].

7. The display device according to claim 1, wherein the following Condition 2-4 is satisfied:

<Condition 2-4>

0.40≤[a total intensity of the $L_2$ in the wavelength band ranging from $-\alpha_R$ to $+\alpha_R$ in the range of 600 nm to 780 nm/a total intensity of the $L_1$ in the wavelength band ranging from $-\alpha_R$ to $+\alpha_R$ in the range of 600 nm to 780 nm].

8. The display device according to claim 1, wherein a difference between the $+\beta_R$ and the $-\beta_R[+\beta_R-(-\beta_R)]$ is 50 to 80 nm.

9. The display device according to claim 1, wherein the optical film X is an optically transparent base material subjected to uniaxial orienting.

10. The display device according to claim 1, further comprising a protective layer for the polarizer A other than optical film X.

11. The display device according to claim 1, wherein a cover rate of BT. 2020 based on the CIE-xy chromaticity diagram of the display element is 60% or more.

12. The display device according to claim 1, wherein the display element is a liquid crystal display element.

13. A method of improving color reproducibility for a display device comprising a display element, and a polarizer A on a surface on a light emitting surface side of the display element, the method comprising providing a plurality of optical films on the polarizer A, wherein the plurality of optical films have properties such that, with the optical film located farthest among the plurality of optical films on the polarizer A from the display element designated as optical film X, and light incident on the optical film X satisfying the following Condition 1-1, the optical film X satisfies the following Condition 2-1 and Condition 2-3:

<Condition 1-1> let $L_1$ represent light incident vertically on the optical film X, among light incident on the optical film X from a display element side; an intensity of the $L_1$ is measured every 1 nm; a blue wavelength band range is from 400 nm to less than 500 nm, a green wavelength band range is from 500 nm to less than 600 nm, and a red wavelength band range is from 600 nm to 780 nm; let $B_{max}$ represent a maximum intensity of the blue wavelength band of the $L_1$, $G_{max}$ represent a maximum intensity of the green wavelength band of the $L_1$, and $R_{max}$ represent a maximum intensity of the red wavelength band of the $L_1$;

let $L_1\lambda_B$ represent a wavelength showing the $B_{max}$, $L_1\lambda_G$ represent a wavelength showing the $G_{max}$, and $L_1\lambda_R$ represent a wavelength showing the $R_{max}$;

let $+\alpha_B$ represent a minimum wavelength showing ½ or less of the intensity of the $B_{max}$, and located in a plus direction side of $L_1\lambda_B$, $-\alpha_G$ represent a maximum wavelength showing ½ or less of the intensity of the $G_{max}$, and located in a minus direction side of $L_1\lambda_G$, $+\alpha_G$ represent a minimum wavelength showing ½ or less of the intensity of the $G_{max}$, and located in a plus direction side of $L_1\lambda_G$, and $-\alpha_R$ represent a maximum wavelength showing ½ or less of the intensity of the $R_{max}$, and located in a minus direction side of $L_1\lambda_R$; and $L_1\lambda_B$, $L_1\lambda_G$, $L_1\lambda_R$, $+\alpha_B$, $-\alpha_G$, $+\alpha_G$ and $-\alpha_R$ satisfy the following relationships (1) to (4), $$+\alpha_B < L_1\lambda_G \tag{1}$$

$$L_1\lambda_B < -\alpha_G \tag{2}$$

$$+\alpha_G < L_1\lambda_R \tag{3}$$

$$L_1\lambda_G < -\alpha_R \tag{4};$$

<Condition 2-1> let $L_2$ represent light that emits vertically from the light emitting surface side of the optical film X, and passes through a polarizer B having an absorption axis parallel to an absorption axis of the polarizer A; an intensity of the $L_2$ is measured every 1 nm; a wavelength at which an inclination of an optical spectrum of the $L_2$ changes from negative to positive is a bottom wavelength, and a wavelength at which the inclination of the optical spectrum of the $L_2$ switches from positive to negative is a peak wavelength;

let $-\beta_R$ represent a maximum wavelength showing ⅓ or less of the intensity of the $R_{max}$, and located in the minus direction side of $L_1\lambda_R$, and $+\beta_R$ represent a minimum wavelength showing ⅓ or less of the intensity of the $R_{max}$, and located in a plus direction side of $L_1\lambda_R$; and a wavelength band ranging from $-\beta_R$ to $+\beta_R$ in the range of 600 nm to 780 nm includes one or more bottom wavelengths and one or more peak wavelengths;

<Condition 2-3> let $-\alpha_R$ represent a maximum wavelength showing ½ or less of the intensity of the $R_{max}$, and located in the minus direction side of $L_1\lambda_R$, and $+\alpha_R$ represent a minimum wavelength showing ½ or less of the intensity of the $R_{max}$, and located in the plus direction side of $L_1\lambda_R$; and a wavelength band ranging from $-\alpha_R$ to $+\alpha_R$ in the range of 600 nm to 780 nm includes one or more bottom wavelengths of the $L_2$ and one or more peak wavelengths of the L, wherein a difference between the $+\alpha_R$ and the $-\alpha_R$ $[+\beta_R-(-\alpha_R)]$ is 42 to 55 nm.

* * * * *